US009013035B2

(12) United States Patent
Zhao et al.

(10) Patent No.: US 9,013,035 B2
(45) Date of Patent: Apr. 21, 2015

(54) THERMAL IMPROVEMENT FOR HOTSPOTS ON DIES IN INTEGRATED CIRCUIT PACKAGES

(75) Inventors: Sam Ziqun Zhao, Irvine, CA (US); Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 959 days.

(21) Appl. No.: 11/514,916

(22) Filed: Sep. 5, 2006

(65) Prior Publication Data

US 2007/0290322 A1 Dec. 20, 2007

Related U.S. Application Data

(60) Provisional application No. 60/814,876, filed on Jun. 20, 2006.

(51) Int. Cl.
*H01L 23/10* (2006.01)
*H01L 23/34* (2006.01)
(Continued)

(52) U.S. Cl.
CPC .......... *H01L 23/4334* (2013.01); *H01L 23/367* (2013.01); *H01L 23/49816* (2013.01); *H01L 24/73* (2013.01); *H01L 2224/2919* (2013.01);
(Continued)

(58) Field of Classification Search
CPC ............. H01L 23/3128; H01L 23/49816; H01L 24/49; H01L 2924/014; H01L 2924/14; H01L 2924/1433; H01L 2225/1058; H01L 2225/06589; H01L 2225/1094; H01L 2224/73207; H01L 23/49568; H01L 2924/01322

USPC ......... 257/706, 720, 737, 738, 779, 780, 787, 257/796, E23.116, E23.124; 438/122, 124, 438/127
See application file for complete search history.

(56) References Cited

U.S. PATENT DOCUMENTS

| 5,247,426 A | 9/1993 | Hamburgen et al. |
| 5,786,635 A | 7/1998 | Alcoe et al. |

(Continued)

FOREIGN PATENT DOCUMENTS

| CN | 1627508 | 6/2005 |
| CN | 1697169 | 11/2005 |

(Continued)

OTHER PUBLICATIONS

Bush, "Fluid Cooling Plugs Direct onto CMOS," Electronic News, Jul. 20, 2005, http://www.reed electronics.com/electronicnews/article/CA626959?nid=2019&rid=550846255).

(Continued)

*Primary Examiner* — Meiya Li
(74) *Attorney, Agent, or Firm* — Sterne, Kessler, Goldstein & Fox P.L.L.C.

(57) ABSTRACT

Methods and apparatuses for improved integrated circuit (IC) packages are described herein. In an aspect, an IC device package includes an IC die having a contact pad, where the contact pad is located on a hotspot of the IC die. The hotspot is thermally coupled to a thermal interconnect member. In an aspect, the package is encapsulated in a mold compound. In a further aspect, a heat spreader is attached to the mold compound, and is thermally coupled to the thermal interconnect member. In another aspect, a thermal interconnect member thermally is coupled between the heat spreader and the substrate.

20 Claims, 21 Drawing Sheets

(51) Int. Cl.
*H01L 23/433* (2006.01)
*H01L 23/367* (2006.01)
*H01L 23/498* (2006.01)
*H01L 23/00* (2006.01)

(52) U.S. Cl.
CPC .......... *H01L 2224/48091* (2013.01); *H01L 2224/48227* (2013.01); *H01L 2224/48247* (2013.01); *H01L 2224/48257* (2013.01); *H01L 2224/48465* (2013.01); *H01L 2224/73265* (2013.01); *H01L 2224/83101* (2013.01); *H01L 2924/01013* (2013.01); *H01L 2924/01029* (2013.01); *H01L 2924/01033* (2013.01); *H01L 2924/01046* (2013.01); *H01L 2924/01077* (2013.01); *H01L 2924/01078* (2013.01); *H01L 2924/01079* (2013.01); *H01L 2924/01082* (2013.01); *H01L 2924/10253* (2013.01); *H01L 2924/16152* (2013.01); *H01L 2924/3025* (2013.01); *H01L 24/48* (2013.01); *H01L 2224/32225* (2013.01); *H01L 2224/32245* (2013.01); *H01L 2924/01005* (2013.01); *H01L 2924/01006* (2013.01); *H01L 2924/01023* (2013.01); *H01L 2924/01047* (2013.01); *H01L 2924/01074* (2013.01); *H01L 2924/01322* (2013.01); *H01L 2924/15311* (2013.01); *H01L 2924/1815* (2013.01); *H01L 2924/12041* (2013.01)

(56) References Cited

U.S. PATENT DOCUMENTS

| | | | |
|---|---|---|---|
| 5,856,911 A | 1/1999 | Riley | |
| 6,265,771 B1* | 7/2001 | Ference et al. | 257/706 |
| 6,294,408 B1 | 9/2001 | Edwards et al. | |
| 6,303,996 B2 | 10/2001 | Lin | |
| 6,313,521 B1 | 11/2001 | Baba | |
| 6,337,445 B1* | 1/2002 | Abbott et al. | 174/260 |
| 6,395,582 B1 | 5/2002 | Sohn et al. | |
| 6,462,274 B1 | 10/2002 | Shim et al. | |
| 6,483,187 B1 | 11/2002 | Chao et al. | |
| 6,528,892 B2 | 3/2003 | Caletka et al. | |
| 6,552,428 B1 | 4/2003 | Huang et al. | |
| 6,797,890 B2 | 9/2004 | Okubora et al. | |
| 6,825,108 B2 | 11/2004 | Khan et al. | |
| 6,848,912 B2 | 2/2005 | Zhang | |
| 6,853,070 B2 | 2/2005 | Khan et al. | |
| 6,861,750 B2 | 3/2005 | Zhao et al. | |
| 6,876,553 B2 | 4/2005 | Zhao et al. | |
| 6,879,039 B2 | 4/2005 | Khan et al. | |
| 6,882,042 B2 | 4/2005 | Zhao et al. | |
| 6,887,741 B2 | 5/2005 | Zhao et al. | |
| 6,906,414 B2 | 6/2005 | Zhao et al. | |
| 6,989,593 B2 | 1/2006 | Khan et al. | |
| 7,005,737 B2 | 2/2006 | Zhao et al. | |
| 7,038,312 B2 | 5/2006 | Khan et al. | |
| 7,078,806 B2 | 7/2006 | Khan et al. | |
| 7,094,060 B2 | 8/2006 | Zhang | |
| 7,102,225 B2 | 9/2006 | Khan et al. | |
| 7,132,744 B2 | 11/2006 | Zhao et al. | |
| 7,161,239 B2 | 1/2007 | Zhao et al. | |
| 7,168,957 B2 | 1/2007 | Zhang | |
| 7,193,320 B2 | 3/2007 | Hosoyamada et al. | |
| 7,196,415 B2 | 3/2007 | Zhong et al. | |
| 7,202,559 B2 | 4/2007 | Zhao et al. | |
| 7,227,256 B2 | 6/2007 | Zhao et al. | |
| 7,241,645 B2 | 7/2007 | Zhao et al. | |
| 7,245,022 B2 | 7/2007 | Farooq et al. | |
| 7,245,500 B2 | 7/2007 | Khan et al. | |
| 7,259,448 B2 | 8/2007 | Zhang et al. | |
| 7,259,457 B2 | 8/2007 | Zhang et al. | |
| 7,271,479 B2 | 9/2007 | Zhao et al. | |
| 7,312,108 B2 | 12/2007 | Zhao et al. | |
| 7,326,061 B2 | 2/2008 | Zhang | |
| 7,432,586 B2 | 10/2008 | Zhao et al. | |
| 7,482,686 B2 | 1/2009 | Zhao et al. | |
| 7,714,453 B2 | 5/2010 | Khan et al. | |
| 7,786,591 B2 | 8/2010 | Khan et al. | |
| 7,791,189 B2 | 9/2010 | Zhao et al. | |
| 2002/0006686 A1* | 1/2002 | Cloud et al. | 438/109 |
| 2002/0079572 A1 | 6/2002 | Khan et al. | |
| 2002/0109226 A1 | 8/2002 | Khan et al. | |
| 2002/0190361 A1 | 12/2002 | Zhao et al. | |
| 2003/0092205 A1* | 5/2003 | Wu et al. | 438/15 |
| 2003/0137057 A1 | 7/2003 | Honda | |
| 2003/0139071 A1 | 7/2003 | Li et al. | |
| 2003/0146509 A1 | 8/2003 | Zhao et al. | |
| 2003/0146520 A1 | 8/2003 | Fang | |
| 2003/0183950 A1 | 10/2003 | Bolken | |
| 2003/0202332 A1* | 10/2003 | Reinikainen et al. | 361/767 |
| 2005/0012203 A1 | 1/2005 | Rahman Khan et al. | |
| 2005/0029657 A1 | 2/2005 | Khan et al. | |
| 2005/0035452 A1 | 2/2005 | Zhang et al. | |
| 2005/0040539 A1 | 2/2005 | Carlsgaard | |
| 2005/0077545 A1 | 4/2005 | Zhao et al. | |
| 2005/0127500 A1 | 6/2005 | Colgan et al. | |
| 2005/0127501 A1 | 6/2005 | Khan et al. | |
| 2005/0224955 A1 | 10/2005 | Desai et al. | |
| 2005/0242426 A1* | 11/2005 | Kwon et al. | 257/690 |
| 2005/0280127 A1 | 12/2005 | Zhao et al. | |
| 2005/0280139 A1 | 12/2005 | Zhao et al. | |
| 2005/0280141 A1 | 12/2005 | Zhang | |
| 2006/0065922 A1 | 3/2006 | Kleint et al. | |
| 2006/0065972 A1 | 3/2006 | Khan et al. | |
| 2006/0091509 A1 | 5/2006 | Zhao et al. | |
| 2006/0091542 A1 | 5/2006 | Zhao et al. | |
| 2007/0007644 A1 | 1/2007 | Zhao et al. | |
| 2007/0023880 A1* | 2/2007 | Hess et al. | 257/678 |
| 2007/0040267 A1 | 2/2007 | Zhao et al. | |
| 2007/0045824 A1 | 3/2007 | Zhao et al. | |
| 2007/0090502 A1 | 4/2007 | Zhao et al. | |
| 2007/0108598 A1 | 5/2007 | Zhong et al. | |
| 2007/0200210 A1 | 8/2007 | Zhao et al. | |
| 2007/0267734 A1 | 11/2007 | Zhao et al. | |
| 2007/0267740 A1 | 11/2007 | Khan et al. | |
| 2007/0273023 A1 | 11/2007 | Zhao et al. | |
| 2007/0273049 A1 | 11/2007 | Khan et al. | |
| 2007/0278632 A1 | 12/2007 | Zhao et al. | |
| 2007/0290376 A1 | 12/2007 | Zhao et al. | |
| 2008/0006934 A1 | 1/2008 | Zhao et al. | |
| 2010/0285637 A1 | 11/2010 | Khan et al. | |

FOREIGN PATENT DOCUMENTS

WO      WO03/081669 A1      10/2003
WO      WO 2005/104314      11/2005

OTHER PUBLICATIONS

Khan, R. et al., U.S. Appl. No. 12/842,627, filed Jul. 23, 2010, entitled "Die Down Ball Grid Array Packages and Method for Making Same," 54 pages.

Jian, C. et al., "SoC Test Scheduling with Hot-Spot Avoidance and Even Distribution," *Journal of Computer-Aided Design & Computer Graphics*, vol. 18, No. 1, Jan. 2006, pp. 46-52.

Office Action, dated Oct. 6, 2009, for U.S. Appl. No. 11/514,917, filed Sep. 5, 2006, 11 pages.

Office Action, dated May 12, 2010, for U.S. Appl. No. 11/514,917, filed Sep. 5, 2006, 11 pages.

Office Action, dated Jan. 14, 2011, for U.S. Appl. No. 11/514,917, filed Sep. 5, 2006, 12 pages.

Examiner's Answer to Appeal Brief, dated Apr. 11, 2012, directed to co-pending U.S. Appl. No. 11/514,917, filed Sep. 5, 2006; 13 pages.

Office Action, dated Jun, 15, 2011, for U.S. Appl. No. 11/514,917, filed Sep. 5, 2006, 11 pages.

English language Abstract of Taiwanese Publication 579555 (B), European Patent Office, espacenet database—Worldwide, (2012).

Kim et al, Leakage Current: Moore's Law Meets Static Power, IEEE Computer, 36(12): 68-75, Dec. 2003.

2004 International Technology Roadmap for Semiconductors (ITRS

(56) References Cited

OTHER PUBLICATIONS

Roadmap) (http://www.itrs.net/Common/2004Update/2004_00_Overview.pdf).

Shakouri and Zhang, "On-Chip Solid-State Cooling for Integrated Circuits Using Thin-Film Microrefrigerators," IEEE Transactions on Components and Packaging Technologies, vol. 28, No. 1, Mar. 2005, pp. 65-69.

Zhao and Avedisian, Enhancing Forced Air Convection Heat Transfer From An Array Of Parallel Plate Fins Using A Heat Pipe, Int. J. Heat Mass Transfer, vol. 40, No. 13, pp. 3135-3147 (1997).

Bush, "Fluid Cooling Plugs Direct onto CMOS," Electronic News, Jul. 20, 2005, http://www.reedelectronics.com/electronicnews/article/CA626959?nid=2019&rid=550846255).

Singer, "Chip Heat Removal with Microfluidic Backside Cooling," Electronic News, Jul. 20, 2005.

Snyder et al, "Hot Spot Cooling using Embedded Thermoelectric Coolers," 22nd IEEE Semi-Therm, Symposium, pp. 135-143 (2006).

English Abstract of CN 1697169, publication date of Nov. 15, 2005.

Office Action cited in U.S. Appl. No. 11/514,917, filed Sep. 5, 2006, dated Sep. 3, 2008.

Office Action cited in U.S. Appl. No. 11/514,917, filed Sep. 5, 2006, dated Apr. 28, 2009.

\* cited by examiner

160

190

970

980

990

THERMAL IMPROVEMENT FOR HOTSPOTS ON DIES IN INTEGRATED CIRCUIT PACKAGES

This application claims the benefit of U.S. Provisional Appl. No. 60/814,876, filed Jun. 20, 2006, which is herein incorporated by reference in its entirety.

BACKGROUND OF THE INVENTION

1. Field of the Invention

The invention relates generally to the field of integrated circuit (IC) device packaging technology, and more particularly to the cooling of hotspots on IC semiconductor die, heat spreading for IC packages, and thermal interconnection technology in IC packaging.

2. Background Art

Electronic signals are carried by electrical current through conductors and transistors in a large scale integrated circuit (IC) fabricated on semiconductor substrate. The energy carried by the electrical current is partially dissipated along the paths of current flow through the IC in the form of heat. Heat generation in electronic semiconductor ICs is also known as power consumption, power dissipation, or heat dissipation. The heat generated, P, in an IC is the sum of dynamic power, $P_D$, and static power, $P_S$:

$$P = P_D + P_S = ACV^2f + VI_{leak}$$

where A is the gate activity factor, C is the total capacitance load of all gates, V is the peak-to-peak supply voltage swing, f is the frequency, and $I_{leak}$ is the leakage current. The static power term, $P_S = VI_{leak}$, is the static power dissipated due to leakage current, $I_{leak}$. A further description regarding static power is provided in Kim et al, Leakage Current: Moore's Law Meets Static Power, IEEE Computer, 36(12): 68-75, December 2003, which is incorporated by reference herein in its entirety.

The dynamic power term, $P_D = ACV^2f$, is the dynamic power dissipated from charging and discharging the IC device capacitive loads. Dynamic power consumption is thus proportional to the operating frequency and the square of operating voltage. Static power consumption is proportional to the operating voltage. Advances in transistor gate size reduction in semiconductor IC technology have reduced the operating voltage and power dissipation for single transistors. However, on-chip power densities are expected continue to rise in future technologies as the industry continues to follow the trend set forth by Moore's Law. In 1965, Intel co-founder Gordon Moore predicted that the number of transistors on a chip doubles about every two years. In addition to the increased number of transistors on a chip, the operating frequencies also double about every two years according to the 2004 International Technology Roadmap for Semiconductors (ITRS Roadmap) (http://www.itrs.net/Common/2004Update/2004_00_Overview.pdf). Because of the increased difficulties in controlling noise margins as voltage decreases, operating voltages can no longer be reduced as quickly as in the past for 130 nm gate lengths and smaller. Consequently, on-chip power dissipation will continue to rise. See Table 6 of the ITRS Roadmap. With the increased use of 65 nm technology in foundry processes and the commercialization of 45 nm technology, power consumption is now a major technical problem facing the semiconductor industry.

Another characteristic of IC chips is the uneven distribution of temperature on a semiconductor die. More and more functional blocks are integrated in a single chip in system-on-chip (SOC) designs. Higher power density blocks create an uneven temperature distribution and lead to "hotspots," also known as "hot blocks," on the chip. Hotspots can lead to a temperature difference of about 5° C. to roughly 30° C. across a chip. Further description of hotspots is provided in Shakouri and Zhang, "On-Chip Solid-State Cooling For Integrated Circuits Using Thin-Film Microrefrigerators," IEEE Transactions on Components and Packaging Technologies, Vol. 28, No. 1, March, 2005, pp. 65-69, which is incorporated by reference herein in its entirety.

Since carrier mobility is inversely proportional to temperature, the clock speed typically must be designed for the hottest spot on the chip. Consequently, thermal design is driven by the temperature of these on-chip hotspots. Also, if uniform carrier mobility is not achieved across the IC die due to on-chip temperature variations across the die, this may result in variations in signal speed and in complicating circuit timing control.

Heat spreaders, including drop-in heat spreaders, heat sinks, and heat pipes have been used in the past to enhance thermal performances of IC packages. Further descriptions of example heat spreaders are provided in U.S. Pat. No. 6,552,428, entitled "Semiconductor Package Having An Exposed Heat Spreader", issued Apr. 22, 2003, which is incorporated by reference herein in its entirety. Further descriptions of example heat pipes are provided in Zhao and Avedisian, "Enhancing Forced Air Convection Heat Transfer From An Array Of Parallel Plate Fins Using A Heat Pipe, Int. J. Heat Mass Transfer, Vol. 40, No. 13, pp. 3135-3147 (1997).

For example, FIG. 1A shows a die up plastic ball grid array (PBGA) package 100 integrated with a drop-in heat spreader 104. In package 100, IC die 102 is attached to a substrate 110 by die attach material 106 and is interconnected with wirebond 114. Package 100 can be connected to a printed wire board (PWB) (not shown) by solder balls 108. A drop-in heat spreader 104 is mounted to substrate 110, and conducts heat away from die 102. Mold compound 112 encapsulates package 100, including die 102, wirebond 114, all or part of drop-in heat spreader 104, and all or part of the upper surface of substrate 110. Drop-in heat spreader 104 is commonly made of copper or other material that is thermally more conductive than mold compound 112. Thermal conductivity values are around 390 W/m*° C. for copper and 0.8 W/m*° C. for mold compound materials, respectively.

Thermal enhancement methods, such as shown in FIG. 1A, rely on heat removal from the entire chip or from the entire package. They maintain semiconductor temperature below the limit of operation threshold by cooling the entire chip indiscriminately. These methods are often ineffective and inadequate to reduce the temperature of the hotspots relative to the rest of the chip, such that operation of the chip is still limited by the hotspots.

For example, FIG. 1B shows a perspective view of a silicon die 102, and in particular shows the temperature distribution on silicon die 102 in a PBGA with no external heat sink. The temperature difference across the die 102 is 13.5° C. FIG. 1C shows die 102 of FIG. 1B, illustrating the effect of adding a drop in heat spreader and a heat sink to the package of die 102. The temperature difference remains 13.0° C. with a large size (45 mm×45 mm×25 mm) external aluminum pin-fin heat sink attached on top of the exposed drop-in heat spreader. Both the drop-in heat spreader and the external heat sink are ineffective to reduce the on-chip temperature differences caused by the hot spots.

Active on-chip cooling methods that use electrical energy to remove heat from the IC chip are known in the art. For example, some have suggested pumping liquid coolant through micro-channels engraved in silicon to circulate on the semiconductor die and carry away waste heat. A further description regarding liquid cooling is provided in Bush, "Fluid Cooling Plugs Direct onto CMOS," Electronic News, Jul. 20, 2005, http://www.reed-electronics.com/electronic-news/article/CA626959?nid=2019 &rid=550846255), which is incorporated by reference herein in its entirety. See also Singer, "Chip Heat Removal with Microfluidic Backside Cooling," Electronic News, Jul. 20, 2005, which is incorporated by reference herein in its entirety.

Other active cooling methods have been developed in an attempt to provide active on-chip cooling using a thin-film thermoelectric cooler (TEC). A further description regarding on-chip cooling with TECs is provided in Snyder et al, "Hot Spot Cooling using Embedded Thermoelectric Coolers," 22nd IEEE SEMI-THERM, Symposium, pp. 135-143 (2006), which is incorporated by reference herein in its entirety.

These active cooling methods require exotic and expensive fluid circulation or micro-refrigeration systems and add to the total power consumption of the package that must be removed. A separate power supply must also be integrated into the IC package to drive the fluid pumping or the TEC systems. These can be costly and can decrease component reliability. Because these solutions are typically expensive, their use is limited in cost sensitive applications such as consumer electronic devices.

These cooling methods as discussed above are inadequate and/or difficult and expensive to implement for commercial applications. What is needed is an inexpensive and reliable system and method of selective heat removal from hot blocks or hotspots on semiconductor dice.

BRIEF SUMMARY OF THE INVENTION

Methods and apparatuses for improved integrated circuit (IC) packages are described herein.

In an aspect of the invention, an IC device package includes an IC die having a contact pad, where the contact pad is located on a hotspot on a surface of the IC die. A thermal interconnect member is attached to the hot spot. In an aspect of the invention, the package is encapsulated in a mold compound. In a further aspect of the invention, the die and thermal interconnect member are also electrically coupled.

In an aspect of the invention, the package also includes a heat spreader. The heat spreader may be thermally coupled to the thermal interconnect member. In a further aspect, the heat spreader is also electrically coupled to the thermal interconnect member. In an aspect of the invention, the heat spreader is completely encapsulated in mold compound. In another aspect, the heat spreader is at least partially exposed. In an aspect of the invention, the heat spreader has a plated area at a location corresponding to a location of the thermal interconnect member.

In an aspect of the invention, an integrated circuit (IC) package is manufactured by a method which includes attaching an IC die to a substrate, enabling electrical interconnection between the die and the substrate through a wire bonding process, coupling at least one thermal interconnect member to at least one contact pad on the die, and encapsulating the package in a mold compound or other encapsulating material. In another aspect of the invention, a portion of a thermal interconnect member (or a plurality of thermal interconnect members) is exposed. In an example aspect, an entire layer of mold compound is removed to expose the thermal interconnect member. In another example aspect, a cavity is carved into the mold compound to expose the thermal interconnect member.

In an aspect of the invention, the manufacturing method further includes coupling a heat spreader to the exposed thermal interconnect member. In an aspect, the heat spreader has plating at one or more location corresponding to the thermal interconnect member.

In another aspect of the invention, a die is analyzed to determine a location of at least one hotspot on a surface of the die that results from operation of the die. In an aspect, the analysis includes mapping functional blocks of the die to determine one or more hotspots. In another aspect, the analysis includes performing a thermal analysis of the die during operation to locate one or more hotspots.

In another aspect of the invention, a package includes a substrate having opposing first and second surfaces, an IC die mounted to the first surface of the substrate, a heat spreader, and a thermal interconnect member that couples the first surface of the substrate to a surface of the heat spreader.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
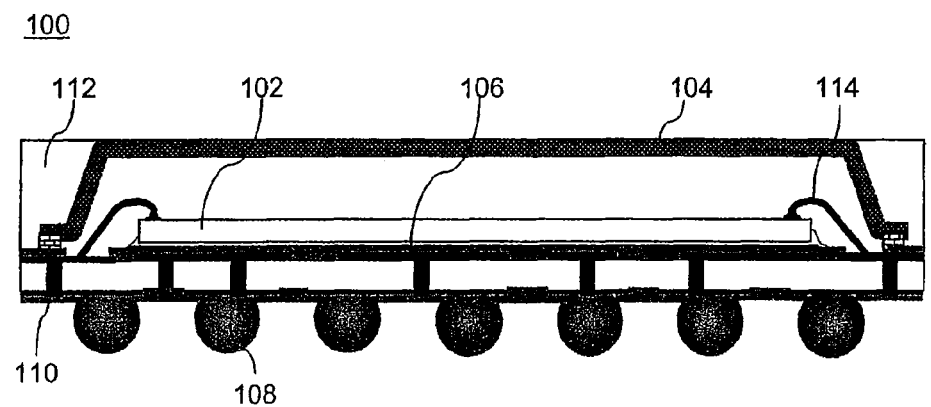
FIG. 1A illustrates a conventional IC package.

Embodiments of the present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

Methods, systems, and apparatuses for IC device packaging technology are described herein. In particular, methods, systems, and apparatuses for the (1) cooling of hotspots on IC semiconductor die, (2) heat spreading for IC packages, and (3) thermal interconnection technology in IC packaging are described.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

Furthermore, it should be understood that spatial descriptions (e.g., "above", "below", "left," "right," "up," "down", "top", "bottom", etc.) used herein are for purposes of illustration only, and that practical implementations of the structures described herein can be spatially arranged in any orientation or manner.

Embodiments of the invention provide enhanced heat removal at desired locations on the surface of the semiconductor die. In conventional devices, entire IC die and/or IC package surfaces are cooled to keep the peak temperatures on the IC die below an operation threshold limit. In contrast, in an embodiment, one or more thermal interconnect members are coupled to one or more surfaces of an IC die. The thermal interconnect members remove heat from hot spots on the die. The thermal interconnect members provide one or more paths for heat transfer from the IC die through a mold that encapsulates the die to the outside environment.

In a further embodiment, the thermal interconnect members are coupled to a heat spreader. When the thermal interconnect members are coupled to a heat spreader integrated in the package, the thermal interconnect members function as thermal bridges through the mold that fills a gap between the die and heat spreader. Locations for the positioning the thermal interconnect members in contact with the die may be selected, by using an on-chip power density map and/or based on chip layout, for example.

In embodiments, one or more of the thermal interconnect members may be implemented with or without a heat spreader in all types of IC packages such as plastic ball grid array (PBGA), fine pitch ball grid array (BGA), land grid array (LGA), pin grid array (PGA), post-molded plastic leadframe packages such as quad flatpack (QFP) and no-lead quad flatpack (QFN) packages, and micro leadframe packages (MLP). For example, embodiments may be implemented in all wire-bond packages encapsulated with molded plastic to provide on-chip hot spot cooling as well as improving device overall heat dissipation capability.

Example Embodiments of Thermal Interconnect Members

In embodiments, thermal interconnect members are thermally conductive solder balls, solder bumps, posts, or other thermally conductive structures. In further embodiments, the thermal interconnect members are also electrically conductive. For the purposes of illustration, exemplary embodiments using a solder ball-based thermal interconnect structure are referred to below to explain the principles of the invention. However, embodiments may use other thermal interconnect structures. Thermal interconnect members may be made of a metal, such as gold, copper, aluminum, silver, nickel, or tin, may be made of a combination of metals/alloy, such as solder, a eutectic (tin, lead), a lead-free solder, may be made of a thermally conductive epoxy or other adhesive material, or may be made of other thermally conductive materials. In an embodiment, a thermal interconnect member is made of a core material that is coated with a bonding material such as solder, gold, silver, an epoxy, or other joining materials that mechanically bonds the thermal interconnect member with contact pads on a semiconductor die. In an embodiment, thermal interconnect members may be pre-deposited at pre-defined contact pads on a surface of the semiconductor die. In a further embodiment, one or more thermal interconnect members are also coupled to a heat spreader.

By attaching thermal interconnect members with a high power dissipation density to contact pads at areas on the die, which may be referred to as points or "blocks", heat generated within these hotspots (also known as hot blocks) can be conducted away from the IC die directly to the external environment or through a thermally conductive heat spreader (if present) to the environment. In an embodiment, the placement of the one or more thermal interconnect members is based on a power map of a semiconductor die for a specific application. In another application, the same semiconductor die may have different on-chip thermal interconnect member locations if a different power maps results from the application. For example, this may occur when different functional blocks of the die switch from a "power-up" mode to a "power-down" mode, or vice versa, for different applications.

Figure 1B:
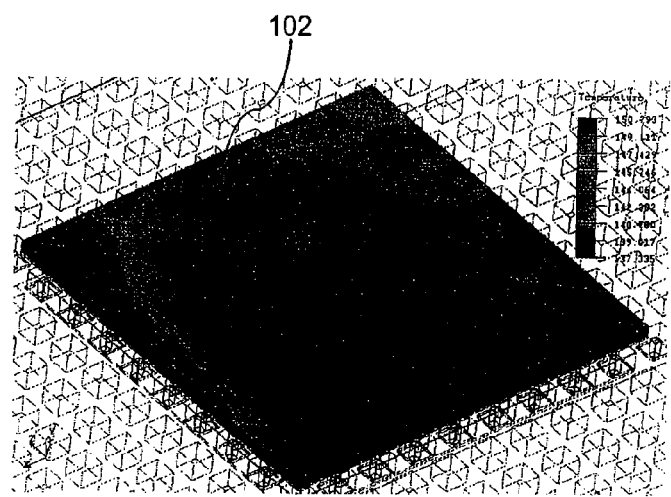
FIGS. 1B and 1C illustrate temperature distributions across a die in the conventional IC package of FIG. 1C using conventional cooling methods.
Figure 1C:
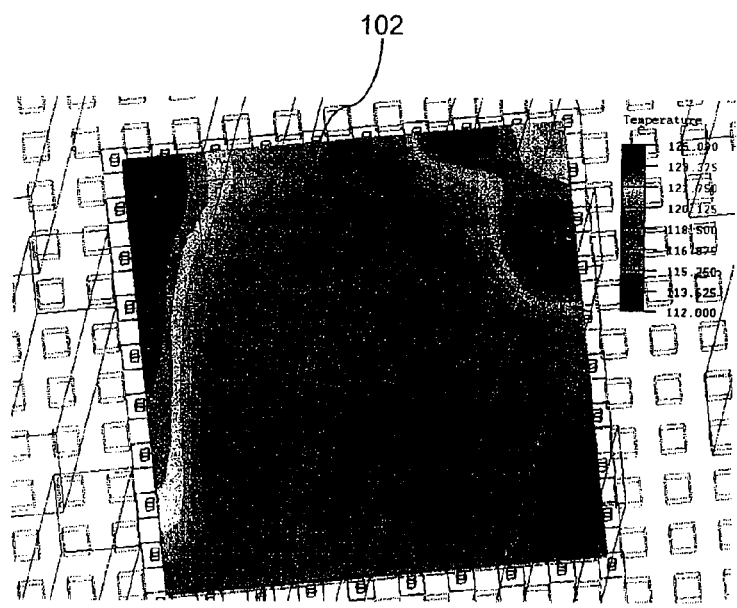

In an embodiment, a die is analyzed to determine a location of at least one hotspot on a surface of the die that results from operation of the die. In one embodiment, the analysis includes mapping functional blocks of the die to determine one or more hotspots. In another embodiment, the analysis includes performing a thermal analysis/measurement (e.g., as shown in FIGS. 1B and 1C) of the die during operation to locate one or more hotspots. As a result of analysis, one or more hotspots may be determined that are located on a surface of the die among other locations of the die that are relatively less hot (cooler) than the hotspots, and thus may need relatively less heat spreading than the hotspots. Thus, according to embodiments of the present invention, the one or more determined hotspots have corresponding thermal interconnect members specifically targeted to them (mechanically/thermally coupled to them), to conduct heat from the hotspots, while conducting less heat from the cooler spots/areas (because a thermal interconnect has not been directly applied to the cooler spots/areas). In this manner, a thermal signature of the die surface can be made more uniform (cooling the hotspots to be closer in temperature to the cooler spots/areas).

For example, some dies have peripheral bond pads (e.g., formed in one or more rings) at a surface of the die for internal I/O signals to be accessible externally from the die. First ends of wire bonds attach to the peripheral bond pads, and second ends of the wire bonds attach to the package substrate or other structures of the package. In embodiments, contact pads are attached to hotspots located in a central region of the surface of the die outside of the peripheral region of the wire bond pads, but in embodiments one or more contact pads may be located in a peripheral region of the surface of the die.

Figure 2A:
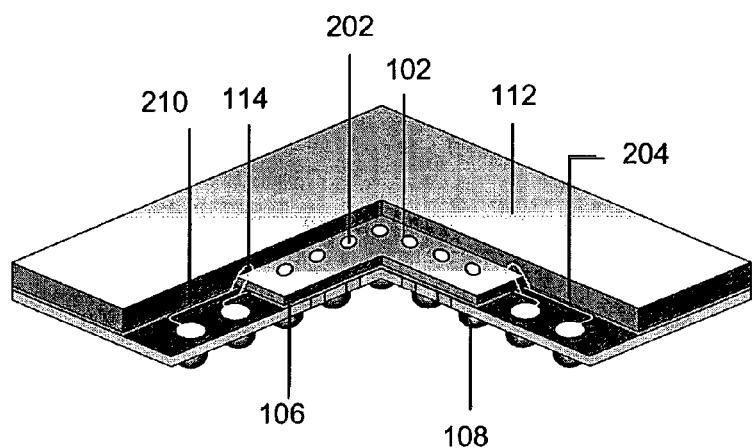
FIGS. 2A-2B illustrate perspective views of example ball grid array (BGA) packages with cut away portions, according to exemplary embodiments of the invention.
Figure 2B:
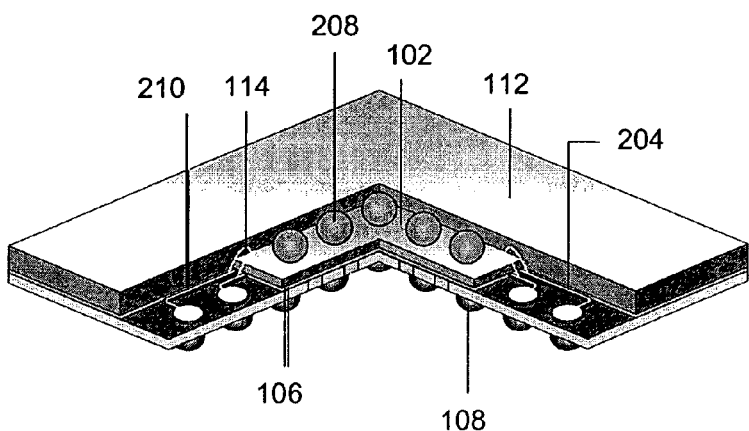
Figure 2C:
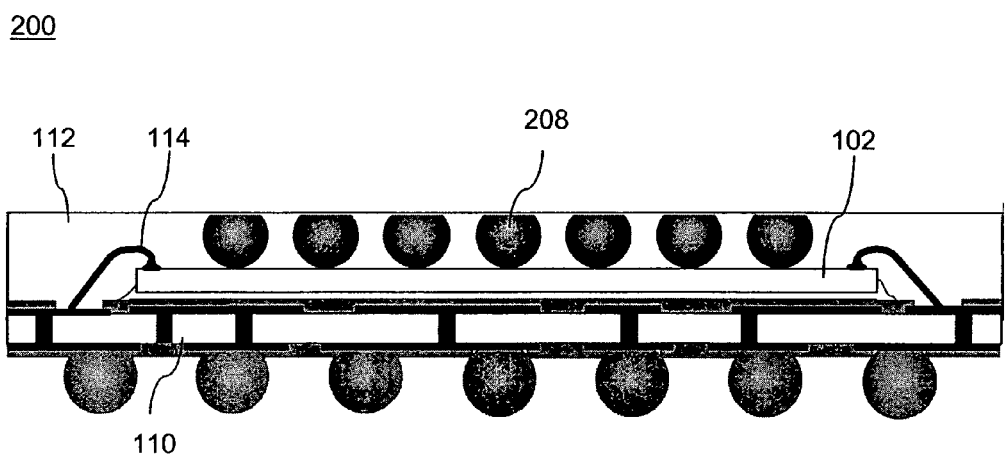
FIG. 2C illustrates a cross-sectional view of an example BGA package, according to an exemplary embodiment of the invention.

FIGS. 2A-2B show perspective cut-away views of an exemplary embodiment of a die up BGA package 200. FIG. 2C illustrates a side cross sectional view of package 200. In package 200, an IC die 102 is electrically connected by a plurality of wire bonds 114 to conductive features (e.g., traces, bond fingers, etc) such as a trace 210 on a top surface of a substrate 110. The conductive features on the top surface of substrate 110 are electrically coupled through substrate 110 (e.g., through one or more electrically and/or non-electrically conductive layers) to solder ball pads on a bottom surface of substrate 110. Solder balls 108 are coupled to the solder ball pads, and are configured to be coupled to a circuit board, such as a printed circuit board (PCB) or printed wire board (not shown in FIGS. 2A-2C).

As shown in FIG. 2A, a top surface of die 102 has at least one contact pad 202, to which at least one thermal interconnect member 208 is coupled. In embodiments, die 102 can have any number of contact pads 202, each for coupling with a thermal interconnect member 208. Contact pads 202 are located at pre-determined hotspots (not shown) on die 102. Hotspots of die 102 are locations on die 102 that are generally hotter than other locations on die 102, although contact pads 202 may be located on locations of die 102 that are not necessarily hotter than other locations of die 102. Mold compound 112 encapsulates package 200. In the embodiments of FIGS. 2B-2C, thermal interconnect members 208 are completely covered with mold compound 112.

Figure 2D:
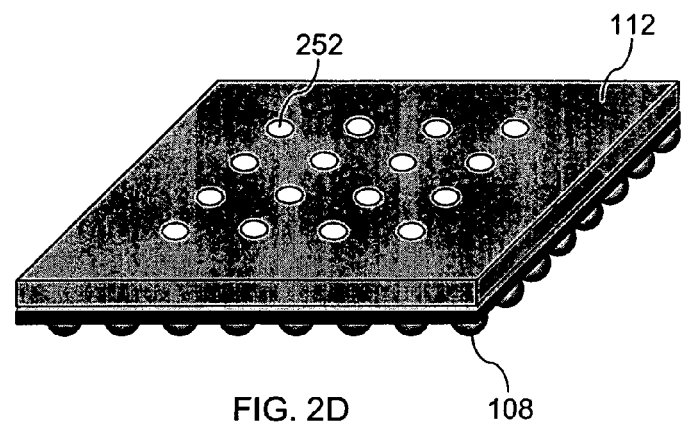
FIG. 2D illustrates a perspective view of an example ball grid array (BGA) package with a cut away portion, according to an exemplary embodiment of the invention.
Figure 2E:
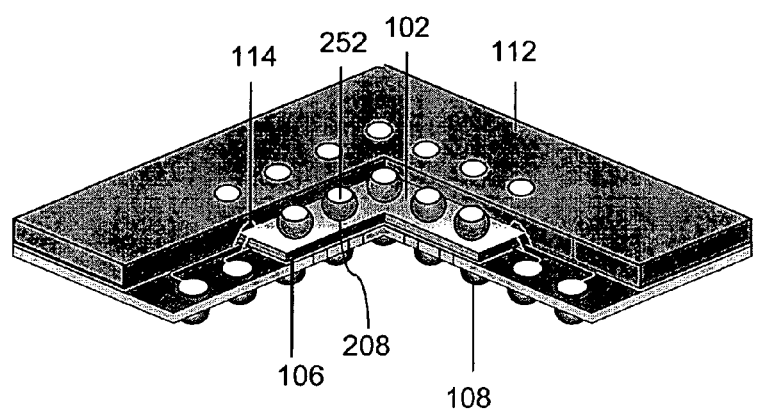
FIG. 2E illustrates a perspective view of an example ball grid array (BGA) package with a cut away portion, according to an exemplary embodiment of the invention.
Figure 2F:
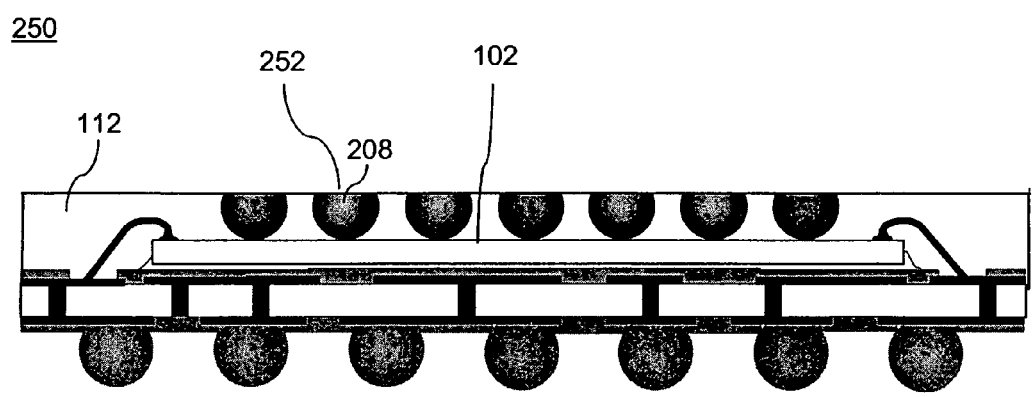
FIG. 2F illustrates a cross-sectional view of an example BGA package, according to an exemplary embodiment of the invention.

FIGS. 2D-2E show perspective views of an exemplary embodiment of a die up BGA IC package 250. FIG. 2F illustrates a side cross sectional view of package 250. Package 250 is similar to package 200, except that mold compound 112 does not encapsulate top surfaces 252 of thermal interconnect members 208. In an embodiment, a top layer of mold compound 112 is removed to expose surfaces 252 of thermal interconnect members 208. In such an embodiment, thermal interconnect members 208 are truncated to form the planar exposed surfaces 252 of thermal interconnect members 208, and surfaces 252 are co-planar with a top surface of mold compound 112. Surfaces 252 can also be referred to as thermal contact pads. Exposed surfaces 252 on package 250 can be used for electrical connections (e.g., ground, power, or signal) to die 102. Various methods exist to truncate the solder spheres embedded in a package mold, including the method illustrated in FIG. 5E, and further described below. Additional example description for solder ball truncation and exposure on a mold top are provided in U.S. Pat. Appl. No. 60/799,657, titled "Interconnect Structure and Formation for Package Stacking of Molded Plastic Area Array Package," filed May 12, 2006, which is incorporated by reference herein in its entirety.

In the embodiments of FIG. 2A-2E, a heat spreader is not present. Thus, thermal performance may be less than if heat spreader is present (as described below). However, the improvement in thermal performance even without a heat spreader may be significant in a particular application due to a reduced junction-to-case thermal resistance resulting from the displacement of mold compound 112 by thermal interconnect members 208.

For example, in an embodiment where thermal interconnect members 208 are solder balls, a junction-to-case thermal resistance is reduced because the thermal conductivity of typical (lead-free and tin/lead) IC package solder balls is around 50~60 W/m*° C., which is many times higher than a typical mold compound 112, which may have a thermal conductivity of approximately 0.8 W/m*° C., for example. Furthermore, the solder balls forming thermal interconnect members 208 attached to IC die 102 extend the heat conduction area from the surface of die 102 to a top surface of mold compound 112. The thermal performance improvement is particularly significant for packages with a small size of die 102, when the solder balls displace a relatively large area of mold compound 112 on the top surface of die 102, providing a conductive path for heat dissipation through the top surface of package 250. Furthermore, when an external heat sink device, such as a heat sink or a metal plate, is attached to the top of a package such as packages 200 and 250, the thermal performance of the package may improve. Examples of such embodiments are described in detail below.

Example Embodiments of Packages with Attached Heat Spreaders

In embodiments, thermal interconnects facilitate on-chip power/heat dissipation from pre-selected locations on a semiconductor die. In an exemplary embodiment, at least one thermal interconnect is attached to an IC die and coupled to at least one heat spreader embedded or attached to the IC package. In an example embodiment, the heat spreader is encapsulated in a mold compound. The heat spreader may be exposed on a top surface of the package for heat dissipation to the ambient environment, including for attachment of a heat sink. The heat spreader can alternatively be entirely encapsulated within the mold compound of a molded IC package.

In embodiments, the heat spreader may have any of a variety of shapes and may include holes, slots, or other surface features for mold locking, heat dissipation, stress reduction, and/or improved reliability. The heat spreader may be made of metal such as copper, copper alloys, other materials typically used in leadframe packages (C151, C194, EFTEC-64T, C7025, etc.), aluminum, other metals or combinations of metals/alloy, and/or thermally conductive nonmetallic materials. The heat spreader may be a flexible tape substrate such as a polyimide tape substrate with one or more metal foil layers laminated on polyimide film. The heat spreader may be made of a thermally conductive but electrically non-conductive material, such as a thermally conductive ceramic, or it may also be electrically conductive.

In an embodiment, a distance between a bottom surface of an integrated heat spreader and a top surface of the die is less than a "loop-height" of the wire bond (i.e., a distance from the apex of the wire loop to the surface of IC die). In such an embodiment, a size of the heat spreader may be confined by a space between the wire bond pads on the opposite sides of the top surface of the IC die.

In another embodiment, the distance between the bottom of the heat spreader and the top of die is greater than the loop-height of wire bond. In this case, the size of the heat spreader is not limited by the distance between the bond pads on the opposite sides of the surface of the die. The size of the heat spreader may be greater than the size of the die, even if all four edges of surface of the die have wire bond interconnections. A larger heat spreader may deliver increased hotspot cooling due to a larger area for heat dissipation. To facilitate thermal connection, and reduce the gap between the IC die and the integrated heat spreader, a pedestal may be used that has an area less than an area of the die, and that extends towards the top surface of the IC die. Alternatively, thermal interconnects may be attached to the bottom of the heat spreader that can be thermally coupled with a corresponding thermal interconnect attached to the IC die.

In an embodiment, an integrated heat spreader is completely encapsulated by mold compound. In another embodiment, it is partially exposed through the mold top, such as in manner similar to drop-in heat spreader 104 shown in FIG. 1A.

In an embodiment where the thermal interconnects are electrically conductive, one or more thermal interconnects may be attached to the ground or power net of the IC die to provide an alternative route for current or on-chip power delivery from the heat spreader. Examples of such an arrangement are described in U.S. patent application Ser. No. 10/952,172, titled "Die Down Ball Grid Array Packages And Method For Making Same," filed Sep. 29, 2004, which is incorporated herein by reference in its entirety. This may be effective in reducing the lengths of on-chip power supply current paths, thus reducing IR voltage drops within the IC die.

Figure 3A:
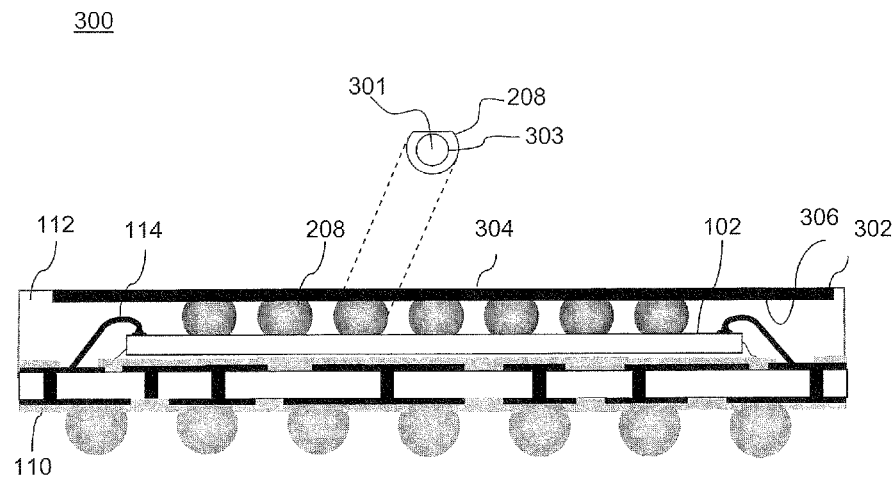
FIGS. 3A-3E illustrate cross-sectional views of example fine pitch ball grid array (BGA) packages having a heat spreader, according to exemplary embodiments of the invention.
Figure 3B:
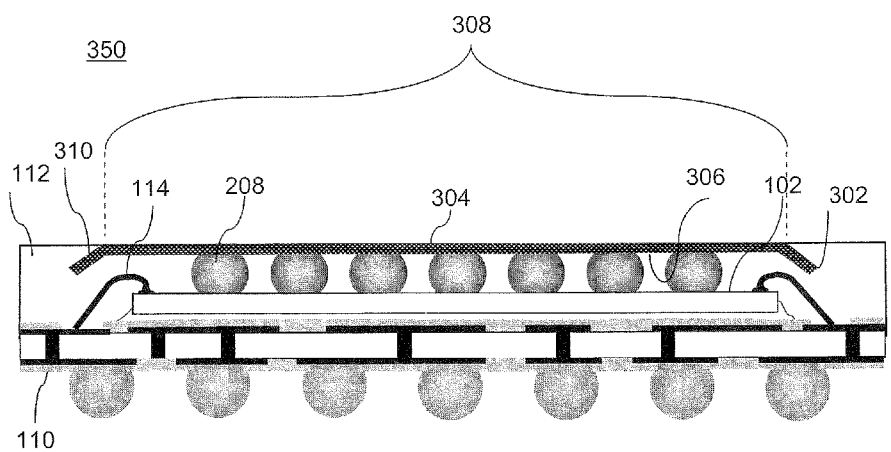
Figure 3C:
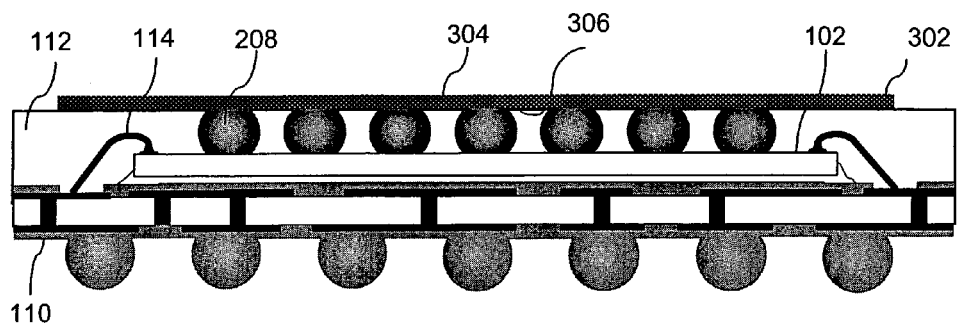

In an embodiment, the size of the heat spreader is less than a size of the package mold body, as illustrated in FIGS. 3A-3C. Alternatively, the size of the heat spreader size can also be substantially the same size as the package mold body, or larger than the size of package mold body. Examples of this are described in U.S. patent application Ser. No. 10/870,927, titled "Apparatus and Method for Thermal and Electromagnetic Interference (EMI) Shielding Enhancement in Die-Up Array Packages," filed Jun. 21, 2004, which is incorporated by reference herein in its entirety.

In the following paragraphs, several exemplary embodiments of the invention are shown in various IC packages. The figures and descriptions are not intended to limit the invention, but merely illustrate the principles of the operation by example. Many of the examples described below include a heat spreader. However, as shown in FIGS. 2A-2F for example, some embodiments of the invention do not have integrated heat spreaders.

Example BGA Embodiments with Integrated Heat Spreader

FIGS. 3A-3E illustrate exemplary embodiments of molded plastic fine pitch ball grid array (BGA) packages having a heat spreader 302 which is at least partially covered by mold compound 112. In the embodiments of FIGS. 3A-3E, the configuration of heat spreader 302 is varied from package to package.

For example, FIG. 3A illustrates a package 300 having a planar heat spreader 302 integrated with package 300 in a partially embedded manner, having a planar top surface 304 of heat spreader 302 exposed (not covered by mold compound 112). In package 300, IC die 102 is electrically interconnected to substrate 110 by one or more wire bonds 114. One or more thermal interconnect members 208 are attached to the top surface of die 102. Mold compound 112 encapsulates die 102, wire bonds 114, a top surface of substrate 110, and thermal interconnect members 208. In an embodiment, mold compound 112 can be formed on substrate 110 using a mold process, a saw singulation technique, or other forming technique. A planar bottom surface 306 of heat spreader 302 is coupled to a top portion of each of thermal interconnect members 208. In FIG. 3A, heat spreader 302 is partially encapsulated by mold compound 112. Bottom surface 306 and the perimeter edges of heat spreader 302 are in contact with mold compound 112, while the top surface 304 of heat spreader 302 is not covered by mold compound. Top surface 304 of heat spreader 302 is co-planar with a top surface of mold compound 112.

In embodiments, heat spreader 302 may be partially or completely encapsulated by mold compound 112. Furthermore, although shown as planar in FIG. 3A, in other embodiments, heat spreader 302 may have other shapes, including regular or irregular shape and planar or non-planar.

FIG. 3A shows an embodiment in which at least one of the thermal interconnect members 208 is made of a core material 301 that is coated with a bonding material 303.

FIG. 3B illustrates a package 350 similar to package 300, but having a non-planar heat spreader 302 integrated with package 300 in a partially embedded manner. In FIG. 3B, heat spreader 302 has cap-like shape, with a cavity side of heat spreader 302 facing towards die 102. Bottom surface 306 of heat spreader 302 is coupled to a top portion of each of thermal interconnect members 208. A planar portion 308 of top surface 304 of heat spreader 302 is not covered by mold compound 112, while the remainder of heat spreader 302 is covered by mold compound 112. For example, a perimeter angled wall portion 310 of heat spreader 302 that angles outward as it extends from the remaining planar portion of heat spreader 302 is covered by mold compound 112.

FIG. 3C illustrates a package 360 having a planar heat spreader 302 (similar to FIG. 3A) integrated with package 360 in a non-embedded configuration. Bottom surface 306 of heat spreader 302 is coupled to a top portion of each of thermal interconnect members 208. Heat spreader 302 is attached to a planar top surface of mold compound 112. Thus, bottom surface 306 of heat spreader 302 is in contact with mold compound 112, while the remainder of heat spreader 302 is not in contact with mold compound 112. Thus, in the embodiment of FIG. 3C, heat spreader 302 can be attached to package 360 after mold compound 112 is applied.

Figure 3D:
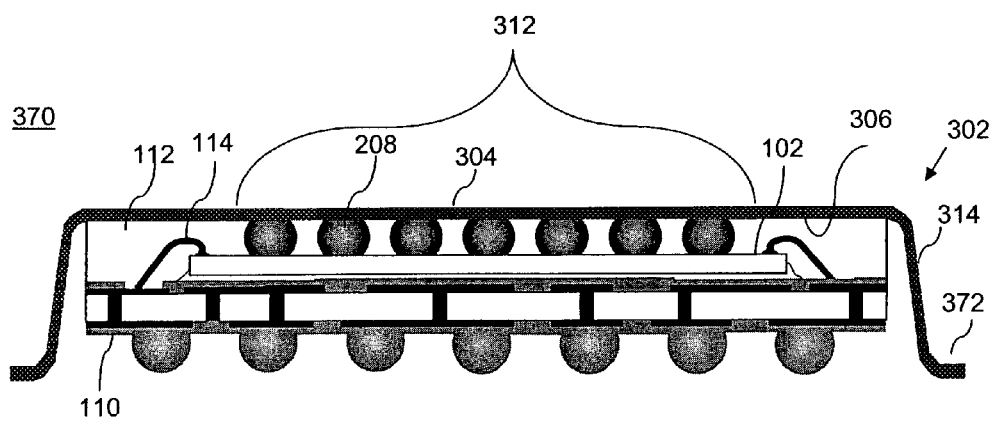

FIG. 3D illustrates a package 370 similar to package 360, but having a non-planar heat spreader 302. Heat spreader 302 has a planar central portion 312 connected to a surrounding plurality of leads 314 that are configured to couple heat spreader 302 to a circuit board (not shown in FIG. 3D) when package 370 is mounted thereto. Bottom surface 306 of central portion 312 attaches thermal interconnect members 208.

Leads 314 of heat spreader 302 each bend down from central portion 312 at a shoulder toward the circuit board. An end of each lead 314 may have a foot 372 that bends outward from heat spreader 302, and is configured to mount to a circuit board, such as for direct thermal and/or electrical coupling to the circuit board.

Figure 3E:
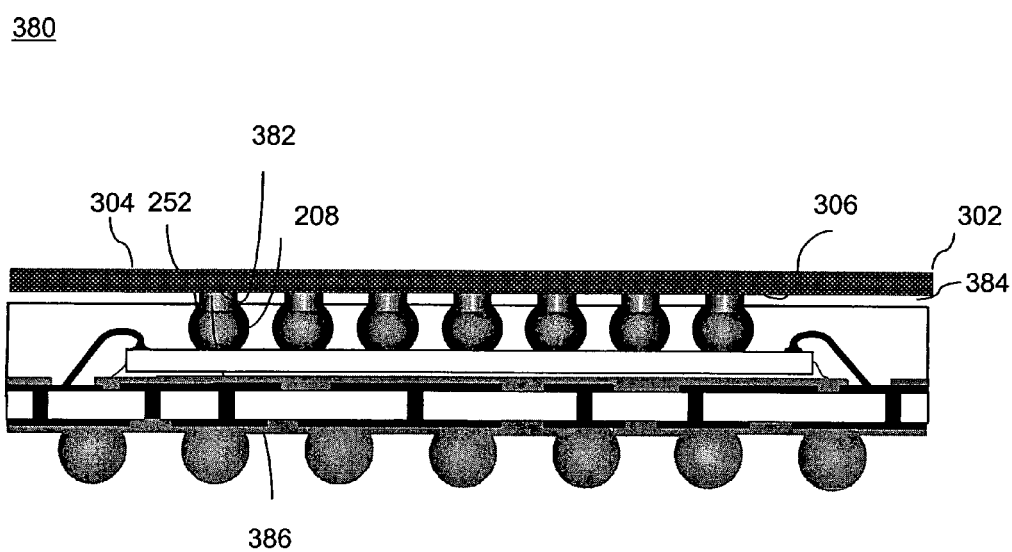

FIG. 3E illustrates a package 380, where thermal interconnect members 208 are truncated solder balls having exposed surfaces 252, similar to the configuration of FIG. 2F. Furthermore, heat spreader 302 has pads 382 located at locations corresponding to surfaces 252 of thermal interconnect members 208. Pads 382 are pre-deposited with a material 386 prior to attachment to surfaces 252. Pre-deposited pads 382 may be plated with a thermally conductive material 386, such as a solder or epoxy that mechanically attaches heat spreader 302 to thermal interconnect members 208. In an embodiment, plating material 386 is also electrically conductive. Heat spreader 302 is coupled to the thermal interconnect members 208 during a reflow, curing, or other attachment process. Furthermore, in an embodiment, an air gap 384 may optionally exist under heat spreader 302, between bottom surface 306 of heat spreader 302 and a top surface of mold compound 112, after manufacture is complete. Plating material 386 supports heat spreader 302 above mold compound 112 at a distance to provide air gap 384.

Example PBGA Embodiments with Integrated Heat Spreader

Figure 4A:
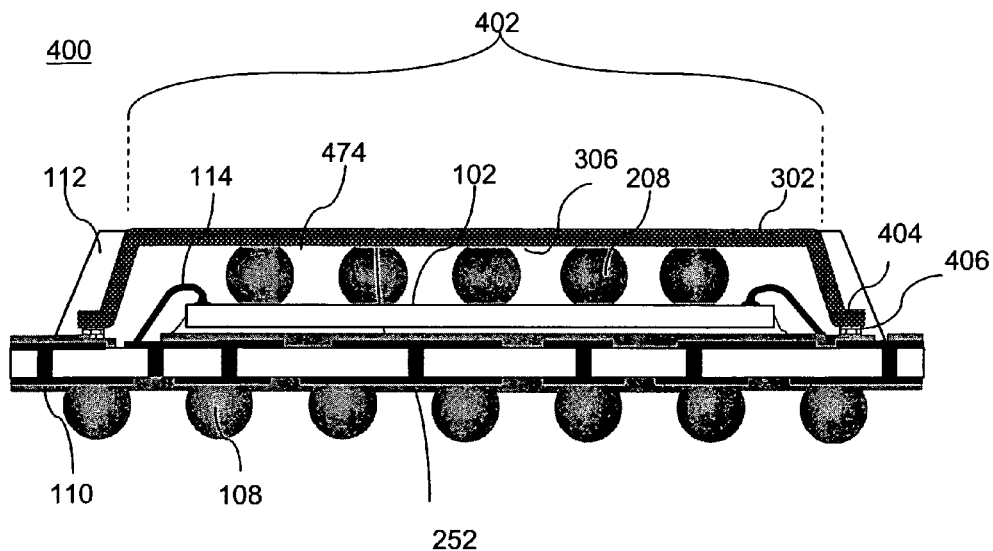
FIGS. 4A-4B illustrate cross-sectional views of example plastic ball grid array (PBGA) packages having a heat spreader, according to exemplary embodiments of the invention.
Figure 4B:
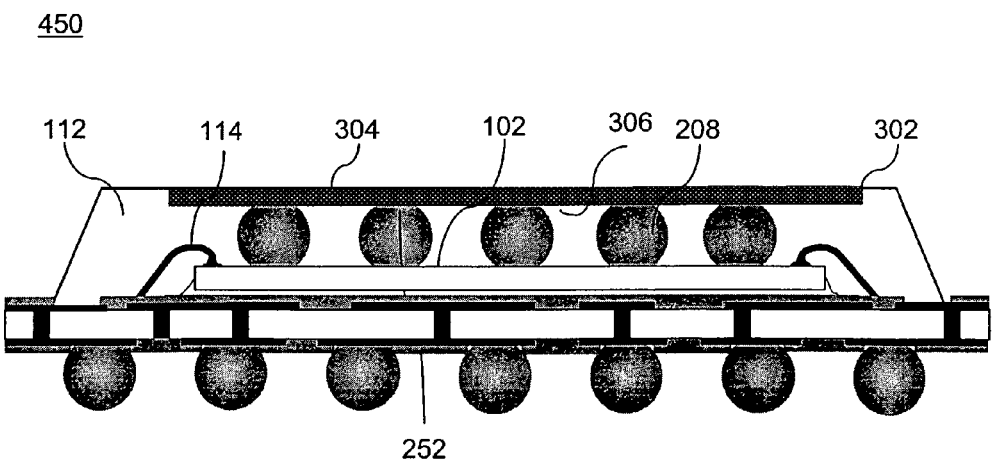

FIGS. 4A-4B illustrate exemplary embodiments of molded plastic ball grid array (PBGA) packages having at least one thermal interconnect member 208 coupled to an integrated heat spreader 302.

FIG. 4A shows a package 400, with a partially embedded heat spreader 302, according to an example embodiment of the present invention. In FIG. 4A, IC die 102 is electrically interconnected to substrate 110 by wire bonds 114. One or more thermal interconnect members 208 are coupled between die 102 and heat spreader 302. Furthermore, thermal interconnect members 208 are shown having a truncated top portion, similar to as described above with respect to FIG. 2F. Bottom surface 306 of heat spreader 302 attaches to top surfaces 252 of thermal interconnect members 208. Mold compound 112 is formed by a molding process, and encapsulates much of package 400, including die 102, wire bond 114, a portion of the top surface of substrate 110, and all of heat spreader 302 except for a planar top portion 402 of heat spreader 302.

In FIG. 4A, heat spreader 302 is cap-shaped, having a cavity 474 facing towards die 102, and enclosing thermal interconnect members 208, die 102, and wire bonds 114 on the top surface of substrate 110. The cap shape of heat spreader 302 has an top planar portion, outward slanting side walls that extend downward from the top planar portion and that surround cavity 474, and a perimeter rim portion 404 around a bottom edge of the side walls. A bottom surface of perimeter rim portion 404 of heat spreader 302 is attached to the top surface of substrate 110 by an adhesive material 406, such as an epoxy, adhesive, solder, or other adhesive.

Heat spreader 302 may be any regular or irregular shape, and planar or non-planar. For example, FIG. 4B shows a package 450 similar to package 400 of FIG. 4A, except that heat spreader 302 is planar in shape. Top surface 304 of heat spreader 302 is not covered by mold compound 112. The outer edges of heat spreader 302 are covered by mold compound 112. Bottom surface 306 of heat spreader 302 is embedded in mold compound 112, and attaches to top surfaces 252 of thermal interconnect members 208.

Example Leadframe Embodiments with Integrated Heat Spreader

Figure 5A:
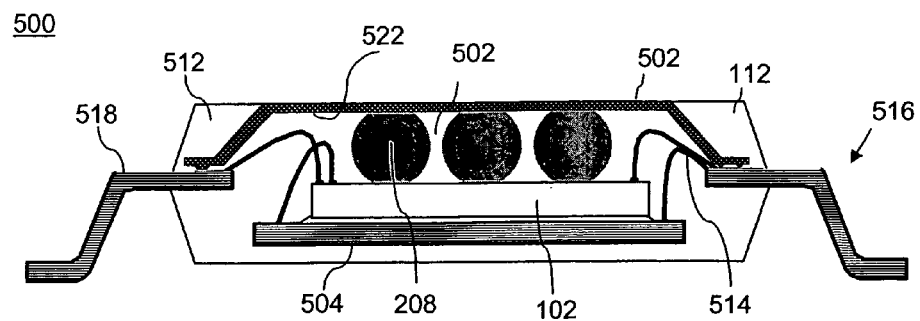
FIGS. 5A-5C illustrate cross-sectional views of example leadframe packages having a heat spreader, according to exemplary embodiments of the invention.
Figure 5B:
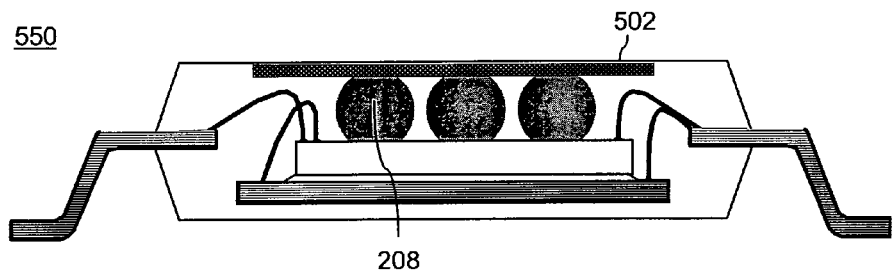
Figure 5C:
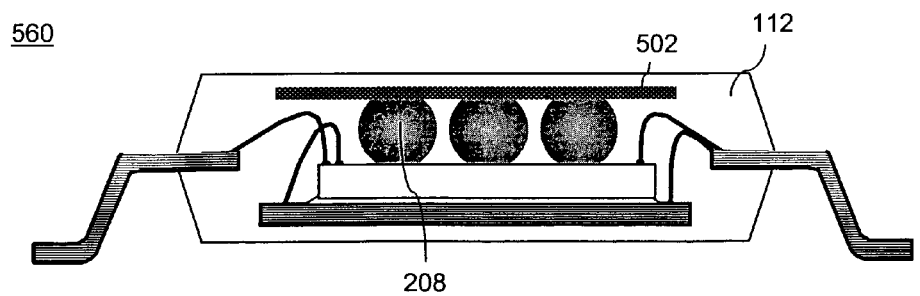

Embodiments of the invention can be implemented in many IC packages. For example, FIGS. 5A-5C illustrate example embodiments having at least one thermal interconnect member 208 and a heat spreader 502 integrated with a leadframe package. For example, FIG. 5A illustrates a package 500 in which die 102 is attached to a die attach pad 504 of a leadframe 516. Leadframe 516 includes a plurality of leads 518 and die attach pad 504. Die 102 is electrically interconnected with die attach pad 504 and/or leads 518 by one or more wire bonds 514. Furthermore, leads 518 may be electrically interconnected with die attach pad 504 with one or more wire bonds 514. Heat spreader 502 is cap-shaped, having a cavity 520 facing towards die 102. Die 102 and a bottom surface 522 in cavity 520 of heat spreader 502 are connected by one or more thermal interconnect members 208, which may or may not be truncated.

Package 500 is encapsulated by mold compound 512, which fills a gap between heat spreader 502 and die 102, including cavity 520. A bottom surface of a perimeter rim portion 524 of heat spreader 502 is mounted to lead frame 516. As shown in FIG. 5A, the bottom surface of perimeter rim portion 524 and lead frame 516 may be configured to interlock for improved mechanical coupling.

FIG. 5B illustrates a package 550 similar to package 500 of FIG. 5A, except that heat spreader 502 is planar, and thus is not mounted to lead frame 516.

FIG. 5C illustrates a package 560 similar to package 550 of FIG. 5B, except that heat spreader 502 is completely embedded in mold compound 112.

Note that although die-up configurations (i.e., circuit side of die 102 is facing away from the circuit board when mounted thereto) are shown in FIGS. 5A-5C, these are shown for the purpose of illustration. Embodiments of the present invention are also applicable to die-down leadframe packages.

In another embodiment, one or more thermal interconnect members 208 may be used in a leadframe package without an integrated heat spreader, in a similar manner as shown in FIGS. 2A-2F for BGA packages.

Example QFN Package Embodiments with Integrated Heat Spreader

Figure 6A:
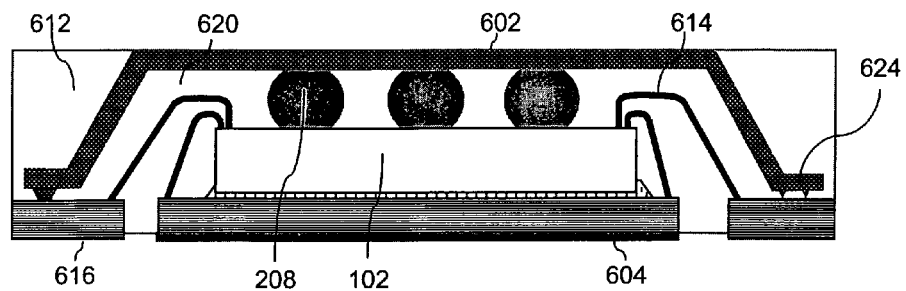
FIGS. 6A-6B illustrate example no-lead quad flat package (QFN) packages having a heat spreader, according to exemplary embodiments of the invention.
Figure 6B:
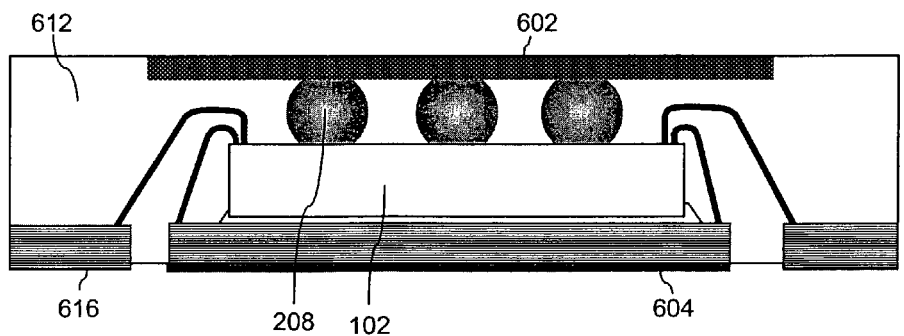

FIGS. 6A and 6B illustrate example embodiments of no-lead quad flat packages (QFP), also known as micro leadframe packages (MLP) or micro lead frame (MLF) IC packages, each having at least one thermal interconnect member 208 and a heat spreader 602 integrated therein. For example, FIG. 6A illustrates a package 600 in which die 102 is attached to a die attach pad 604. Die 102 is electrically interconnected with die attach pad 604 and/or leads 616 by one or more wire bonds 614. Heat spreader 602 is cap-shaped, having a cavity 620 facing towards die 102. Die 102 and a bottom surface 622 in cavity 620 of heat spreader 602 are connected by one or more thermal interconnect members 208, which may or may not be truncated.

Package 600 is encapsulated by mold compound 612, which fills a gap between heat spreader 602 and die 102, including cavity 620. A bottom surface of a perimeter rim portion 624 of heat spreader 602 is mounted to leads 616. As shown in FIG. 6A, the bottom surface of perimeter rim portion 624 and leads 616 may be configured to interlock for improved mechanical coupling.

FIG. 6B illustrates a package 650 similar to package 600 of FIG. 6A, except that heat spreader 602 is planar, and thus is not mounted to leads 616.

Figure 7A:
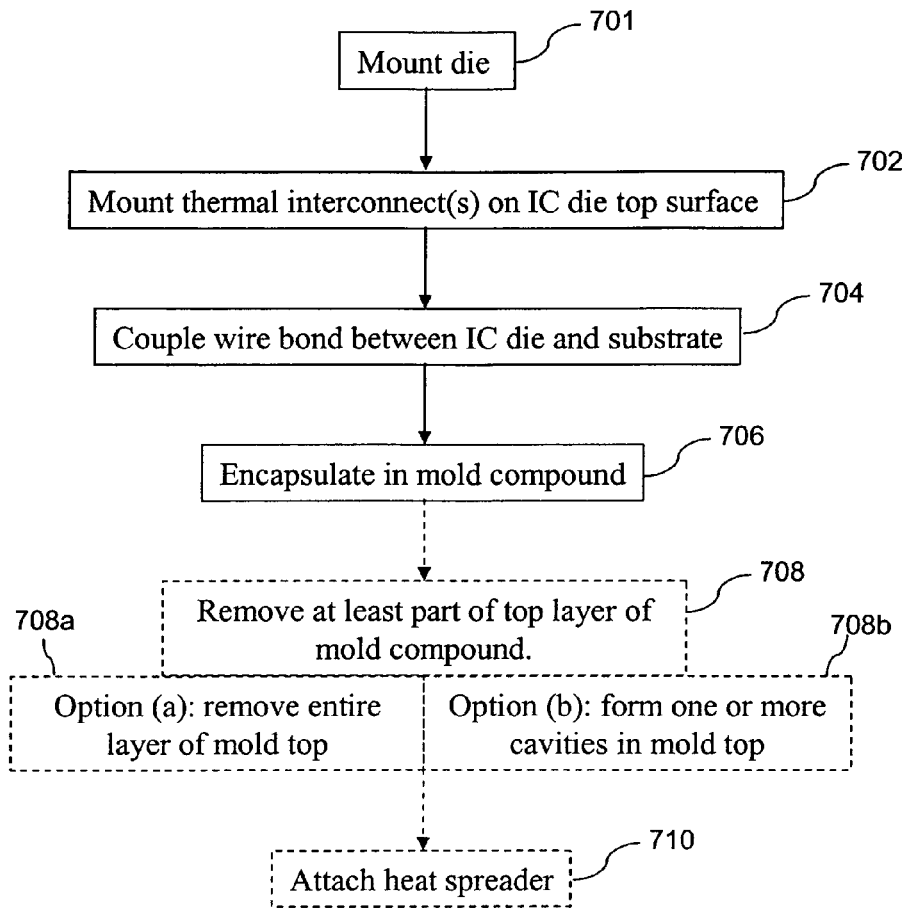
FIG. 7A shows a flowchart providing examples steps for assembling an integrated circuit package, according to exemplary embodiments of the invention.

Example Embodiment of a Manufacturing Process for IC Packages: Encapsulate Before Attaching Optional Heat Spreader FIG. 7A shows a flowchart 700 providing an example process for manufacturing embodiments of the invention. Flowchart 700 is described with reference to FIGS. 7B-D, which show a BGA package at various stages of manufacture. Flowchart 700 may be applied in a modified or non-modified manner to manufacture other package types, as would be understood by persons skilled in the relevant art(s) from the teachings herein. In flowchart 700, an optional step of attaching a heat spreader (step 710) may be performed depending on whether a heat spreader is desired to be present.

Flowchart 700 begins with step 701. In step 701, a die is mounted to a substrate. For example, the die is die 102 shown in FIGS. 2A-2C, which is attached to substrate 110 using die attach material 106. Die attach material 106 may be any type of suitable adhesive material, such as an epoxy and/or film adhesive, or other type of adhesive material or attachment mechanism.

Figure 7B:
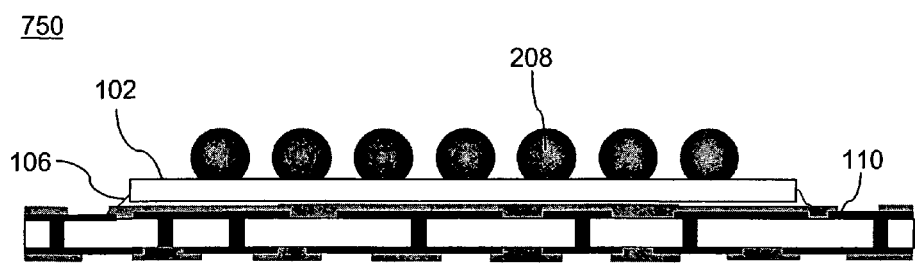
FIGS. 7B-7F illustrate cross-sectional views of an integrated circuit package during various phase of assembly, where encapsulation occurs before heat spreader attachment, according to exemplary embodiments of the invention.

In step 702, thermal interconnects are mounted on a top surface of the die. For example, one or more thermal interconnect members 208 are mounted on contact pads 202 on die 102, as shown in FIGS. 2A-2C. FIG. 7B illustrates an example partially assembled package 750 after steps 701 and 702. In an embodiment, a conventional ball mount process used for mounting solder balls to the bottom of BGA packages may be used to mount a solder ball to die 102, when thermal interconnect members 208 are solder balls.

Figure 7C:
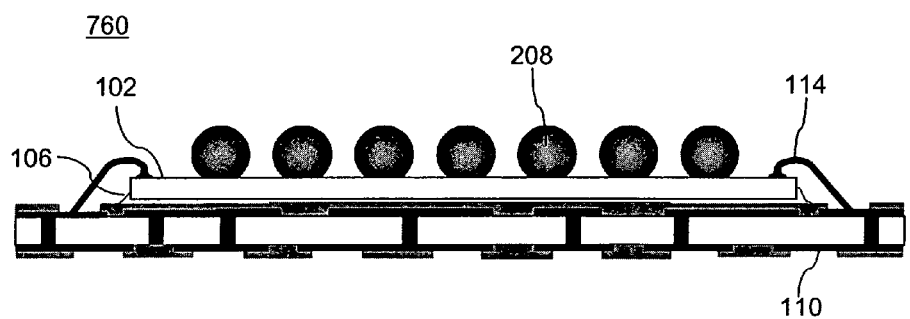

In step 704, wire bonds are coupled between the die and substrate. For example, die 102 may be electrically connected to substrate 110 through a wire bonding process that attaches wire bonds 114. FIG. 7C illustrates an example partially assembled package 760 after steps 701-704.

Figure 7D:
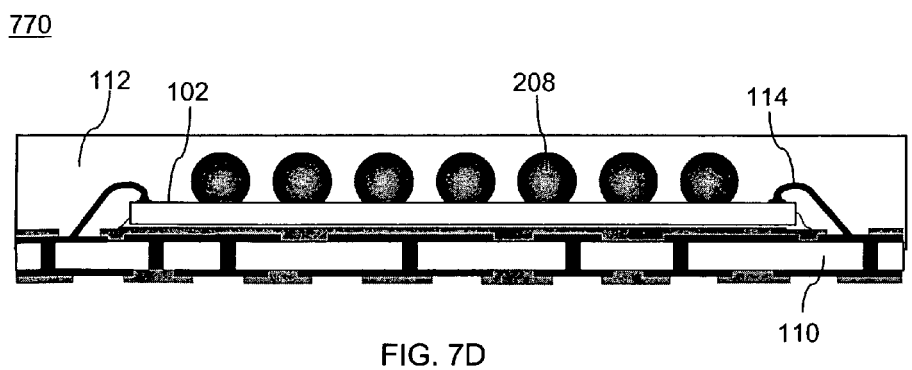

In step 706, the package is encapsulated in mold compound. For example, the mold compound is mold compound 112. As shown in FIGS. 2A-2C, mold compound 112 covers die 102, wire bond 114, at least one thermal interconnect member 208, and all or part of substrate 110. FIG. 7D illustrates an example a partially assembled package 770 after steps 701-706.

In an optional step 708, a portion or all of a top layer of the mold compound is removed. For example, in an embodiment, a layer of mold compound 112 is removed such that one or more thermal interconnect members 208 are truncated (i.e., a top portion of thermal interconnect member 208 is removed along with a portion of the top layer, or the entire top layer of mold compound 112).

Figure 7E:
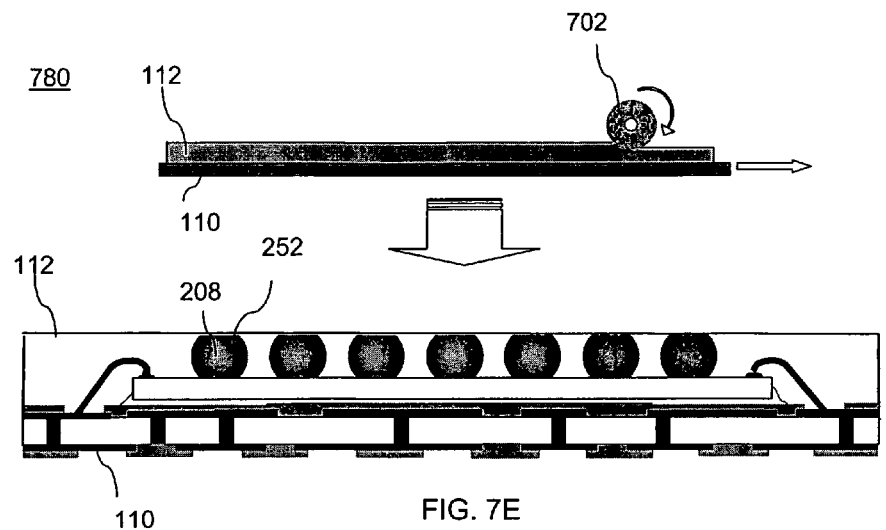

FIG. 7A shows step 708 as optionally including one of steps 708a and 708b. In optional step 708a, an entire top layer of the mold compound is removed, such as shown in FIG. 2F. FIG. 7E illustrates an example implementation of step 708a, where a grinding tool 702 is used to grind away an entire top layer of molding compound 112, thereby grinding away a portion of thermal interconnect members 208 and exposing surface 252 of thermal interconnect members 208.

Figure 7F:
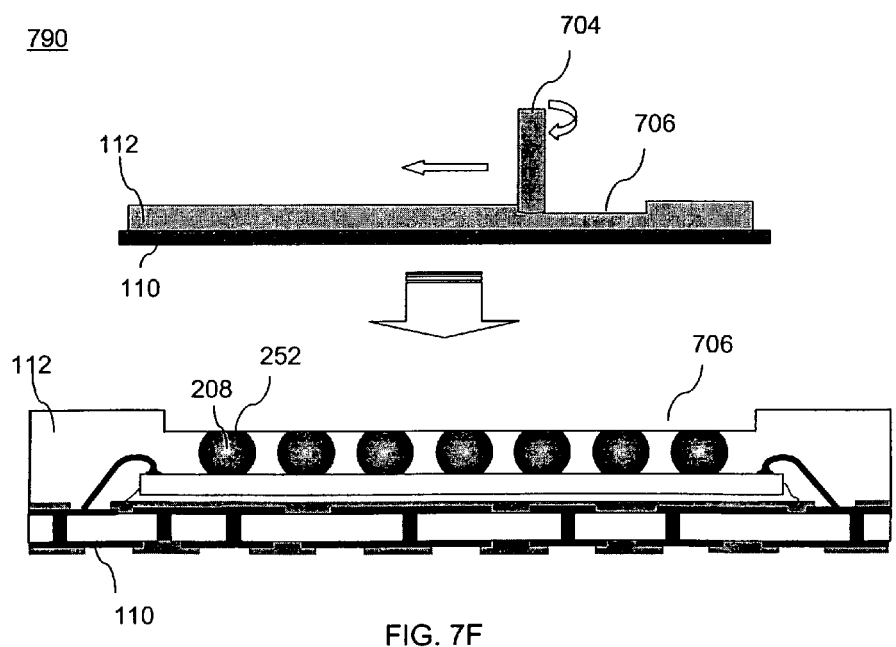

In optional step 708b, a cavity is formed in the mold compound. FIG. 7F illustrates an example implementation of step 708b. As shown in FIG. 7F, a routing tool 704 is used to route away a central portion of a top layer of mold compound 112 to form a cavity 706 in the top layer of mold compound 112. In the process of forming cavity 706, routing tool 704 routes away a portion of thermal interconnect members 208 that are under cavity 706, to expose surface 252 of the centrally located thermal interconnect members 208.

In embodiments, other methods of material removal than those described above may be used in steps 708, 708a, and 708b to remove mold top material and expose and/or truncate one or more thermal interconnects. Other surface machining methods such as etching or laser machining may used to remove mold material and expose thermal/electrical interconnect elements.

As described above, step 708 (and sub-steps 708a and 708b) is optional. In an alternative embodiment, step 708 is not performed, and a layer and/or cavity of mold compound is not removed.

In optional step 710, a heat spreader is attached to the package. For example, the heat spreader is heat spreader 302, 502, 602, or 702, described above. In an embodiment of a package not having a heat spreader, optional step 710 is not performed. When step 710 is performed, the heat spreader is coupled to the one or more exposed thermal interconnects, which may or may not be truncated.

Note that the steps of flowchart 700 may be performed in orders other than shown in FIG. 7A. For example, step 704 may be performed before thermal interconnects are attached to the die surface in step 702.

Figure 8A:
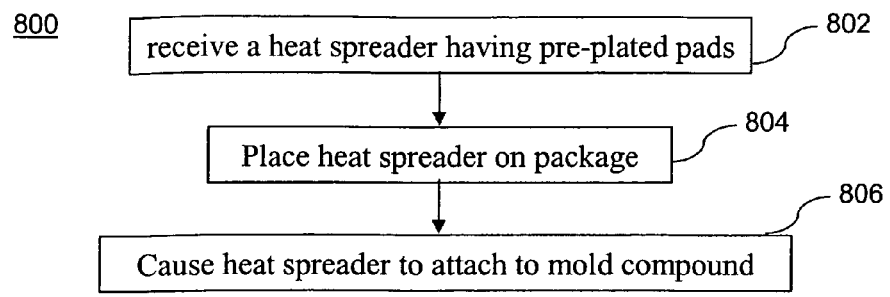
FIG. 8A shows a flowchart providing examples steps for assembling an integrated circuit package, according to exemplary embodiments of the invention.
Figure 8B:
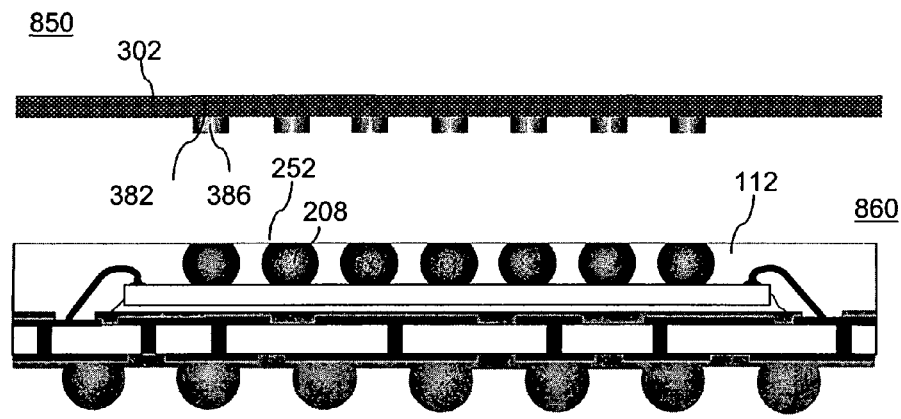
FIGS. 8B-8C illustrate cross-sectional views of attaching a heat spreader to an integrated circuit package, according to exemplary embodiments of the invention.

FIG. 8A illustrates a flowchart 800 showing a process for attaching a heat spreader to an IC package. Flowchart 800 is described with reference to FIGS. 8B-C, which show a BGA package at various stages of manufacture. Flowchart 800 may be applied in a modified or non-modified manner to manufacture other package types, as would be understood by persons skilled in the relevant art(s) from the teachings herein Flowchart 800 begins in step 802. In step 802, a heat spreader having one or more pre-plated pads is received. For example, the heat spreader is heat spreader 302, as shown in FIG. 8B. FIG. 8B shows a partially assembled package 850 and heat spreader 302. Heat spreader 302 has pads 382 that are plated with plating material 386. Plating material 386 may be a thermally conductive substance, for example, solder or epoxy.

Figure 8C:
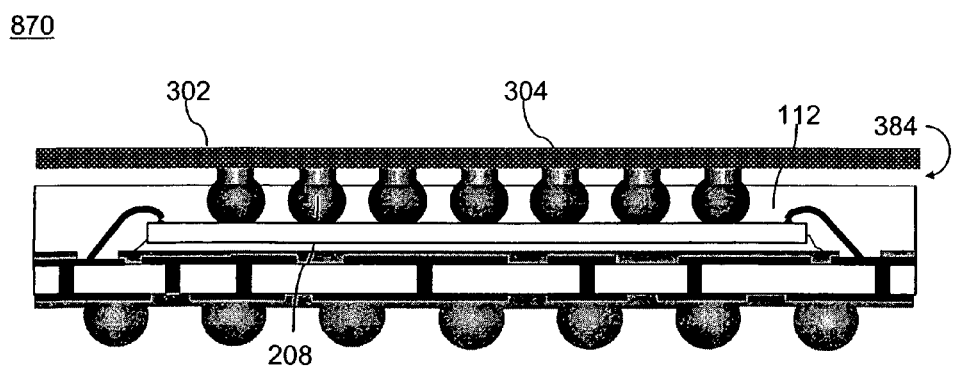

In step 804, the heat spreader is placed on the package. For example, as shown in FIG. 8C, heat spreader 302 is placed on partially assembled package 860, such that plating material 386 is in contact with surface 252 of thermal interconnects 252.

In step 806, the heat spreader is caused to become attached to the package. For example, to attach the heat spreader and package, a reflow or curing process may be conducted. The reflow or curing process causes heat spreader 302 to become attached to partially assembled package 860, to form package 870, as illustrated in FIG. 8C. A reflow process may be used for a solder plating embodiment for plating material 386, or a curing process may be used for an epoxy material embodiment of plating material 386. After assembly, the completed package may have an air gap 384 between heat spreader 302 and mold compound 112.

Figure 9A:
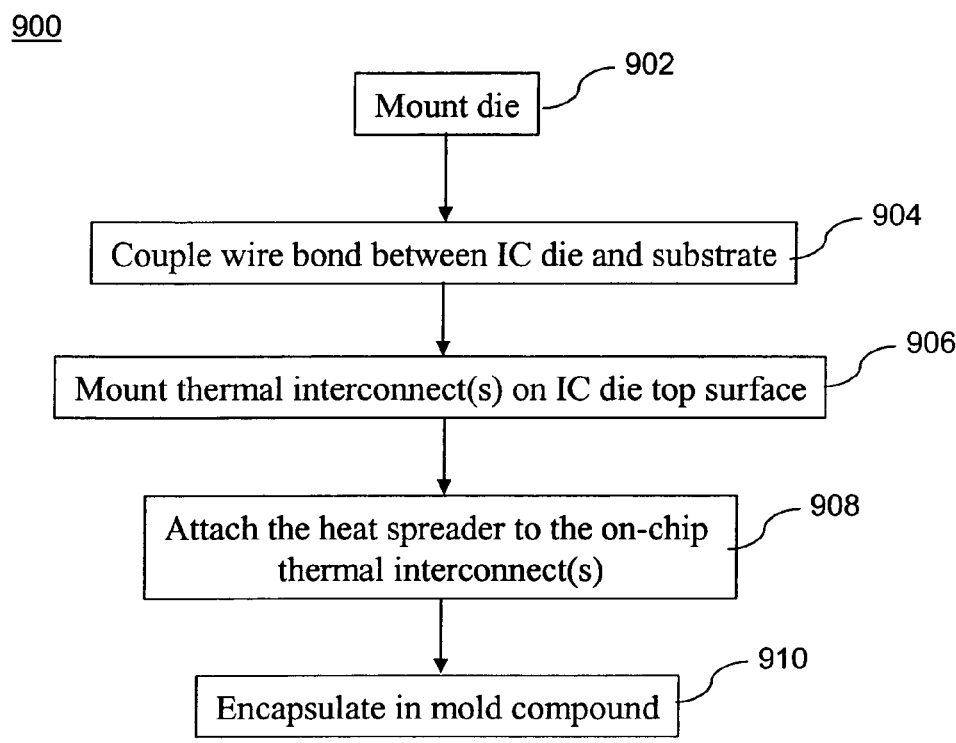
FIG. 9A shows a flowchart providing examples steps for assembling an integrated circuit package, according to exemplary embodiments of the invention.

Example Embodiment of Manufacturing Processes for IC Packages: Encapsulate after Attaching Heat Spreader FIG. 9A shows a flowchart 900 providing an example process for manufacturing embodiments of the invention. Flowchart 900 is described with reference to FIGS. 9B-D, which show a BGA package at various stages of manufacture. Flowchart 900 may be applied in a modified or non-modified manner to manufacture other package types, as would be understood by persons skilled in the relevant art(s) from the teachings herein.

Flowchart 900 begins with step 902. In step 902, a die is mounted to a substrate. For example, the die is die 102 of FIG. 3A, which is attached to substrate 110.

In step 904, wire bonds are coupled between the die and the substrate. For example, as shown in FIG. 3A, die 102 is electrically connected to substrate 110 through a wire bonding process that applies wire bonds 114.

Figure 9B:
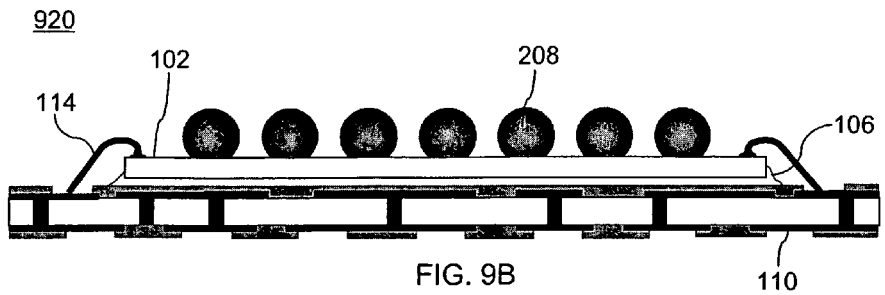
FIGS. 9B-9D illustrate cross-sectional views of an integrated circuit package during various phase of assembly, where encapsulation occurs after heat spreader attachment, according to exemplary embodiments of the invention.

In step 906, thermal interconnects are mounted to a top surface of the die. For example, one or more thermal interconnect members 208 may be mounted to contact pads 202 on the top surface of die 102. FIG. 9B illustrates an example partially assembled package 920 after steps 902, 904, and 906. In an embodiment, a conventional ball mount process used for mounting solder balls to the bottom of BGA packages is used to mount a thermal interconnect members 208 to die 102.

Figure 9C:
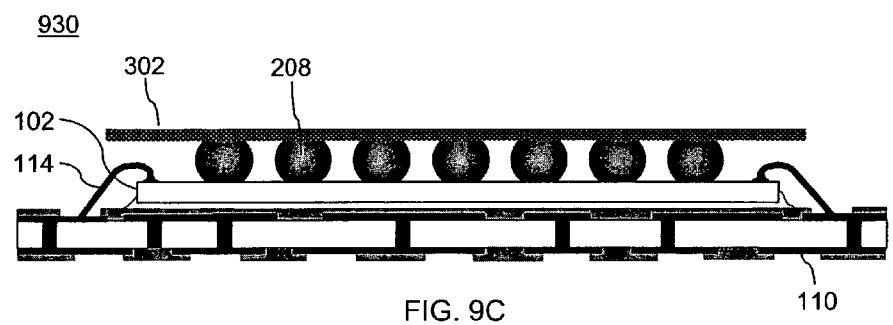

In step 908, the heat spreader is attached to the thermal interconnects. For example, as shown in FIG. 3A, heat spreader 302 is attached to thermal interconnect members 208. In a further embodiment, heat spreader 302 may have pre-plated pads, such as shown in FIG. 3E. FIG. 9C illustrates an example partially assembled package 930 after steps 902-908.

Figure 9D:
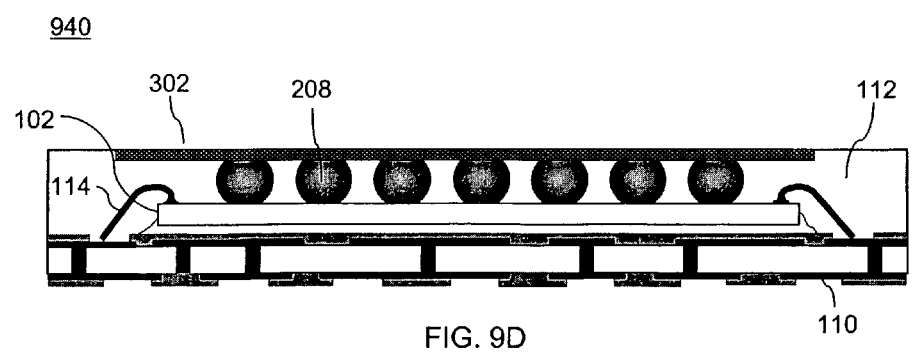

In step 910, the package is encapsulated in mold compound. For example, as shown in FIG. 3A, mold compound 112 covers die 102, wire bond 114, at least one thermal interconnect member 208, and all or part of substrate 110. FIG. 9D illustrates an example partially assembled package 940 after steps 902-910.

Note that the steps of flowchart 900 may be performed in orders other than shown in FIG. 9A. For example, step 906 may be performed before step 904.

Figure 9E:
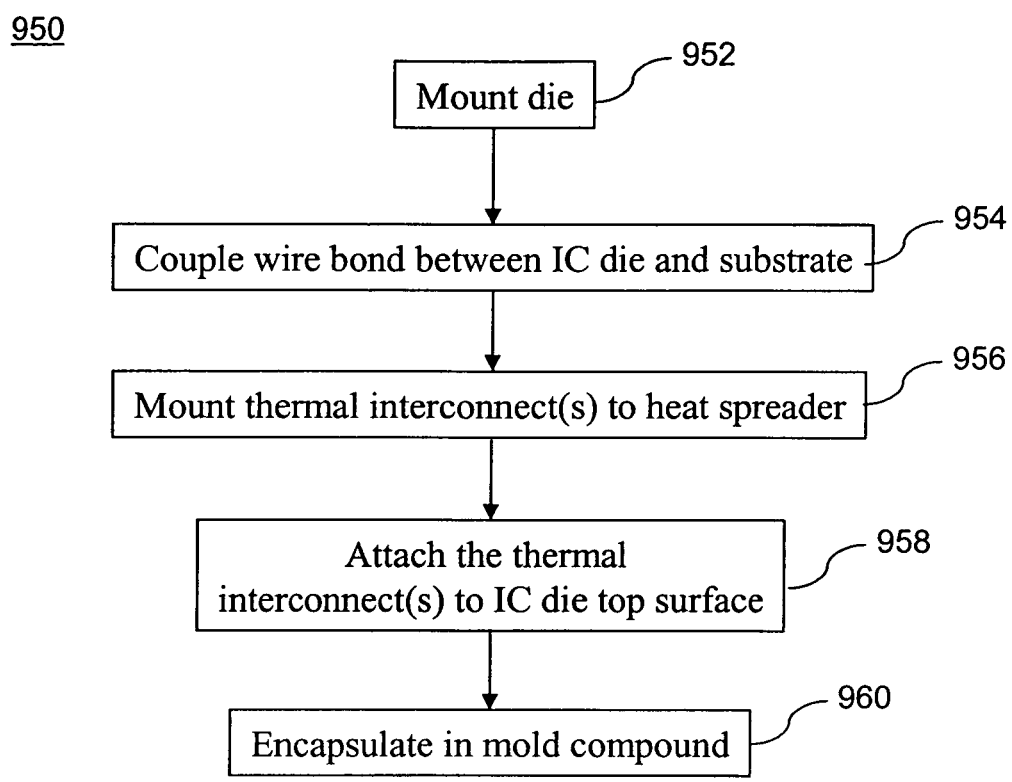
FIG. 9E shows a flowchart providing examples steps for assembling an integrated circuit package, according to exemplary embodiments of the invention.

In a further embodiment, thermal interconnects may be attached to the heat spreader before being attached to the die. FIG. 9E shows a flowchart 950 providing an example process for manufacturing embodiments of the invention. Flowchart 950 is described with reference to FIGS. 9F-H, which show a BGA package at various stages of manufacture. Flowchart 950 may be applied in a modified or non-modified manner to manufacture other package types, as would be understood by persons skilled in the relevant art(s) from the teachings herein.

Flowchart 950 begins with step 952. In step 952, a die is mounted to a substrate. For example, the die is die 102 of FIG. 3A, which is attached to substrate 110.

In step 954, wire bonds are coupled between the die and the substrate. For example, as shown in FIG. 3A, die 102 is electrically connected to substrate 110 through a wire bonding process that applies wire bonds 114.

Figure 9F:
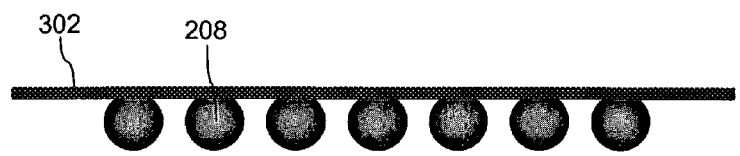
FIGS. 9F-9H illustrate cross-sectional views of an integrated circuit package during various phase of assembly, where encapsulation occurs after heat spreader attachment, according to exemplary embodiments of the invention.

In step 956, thermal interconnects are mounted to a bottom surface of the heat spreader. For example, one or more thermal interconnect members 208 may be mounted to bottom surface 306 of heat spreader 302, as shown in FIG. 9F. In an embodiment, a conventional ball mount process used for mounting solder balls to the bottom of BGA packages is used to mount thermal interconnect members 208 to heat spreader 302. In a further embodiment, heat spreader 302 has pre-plated pads (not shown in FIG. 9F).

Figure 9G:
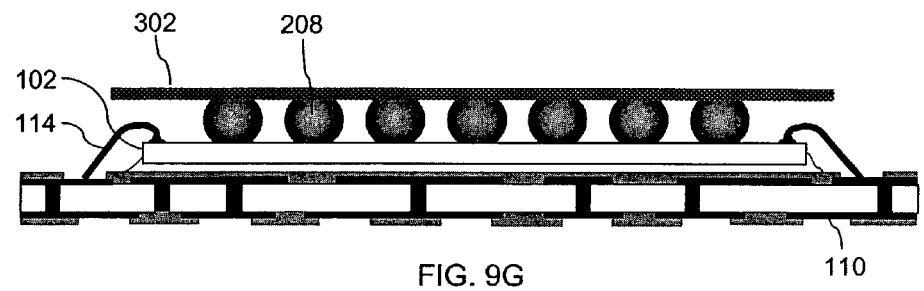

In step 958, the thermal interconnects are attached to the top surface of the die. For example, thermal interconnect members 208 are attached to die 102. FIG. 9G illustrates an example partially assembled package 980 after step 958.

Figure 9H:
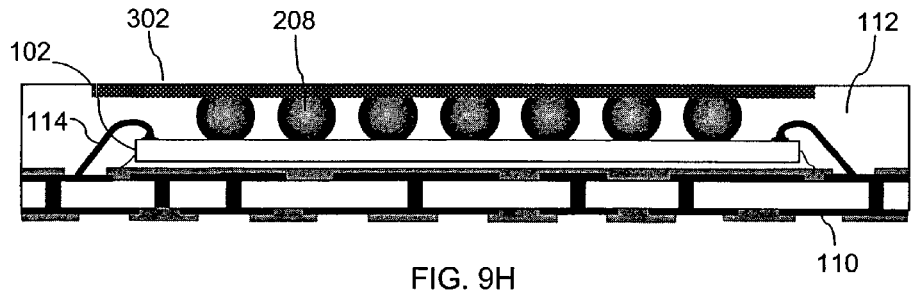

In step 960, the package is encapsulated in mold compound. For example, mold compound 112 is used to cover die 102, wire bonds 114, thermal interconnect members 208, and all or part of substrate 110. FIG. 9H illustrates an example partially assembled package 990 after completion of steps 902-910.

Example Embodiments of Substrate Coupled Heat Spreader

Figure 10A:
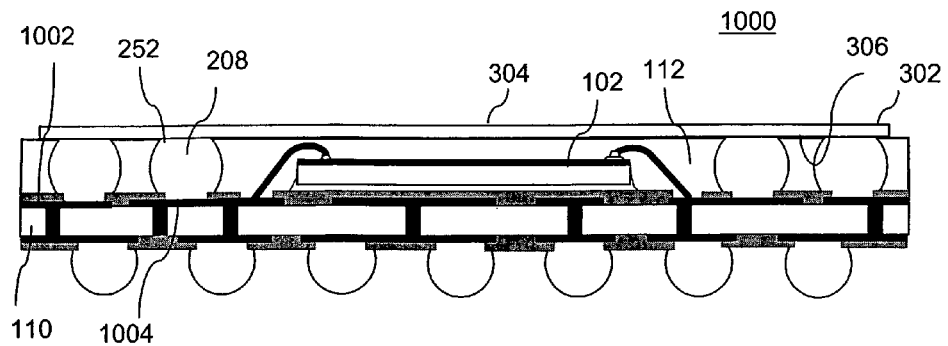
FIGS. 10A-10C illustrate cross-sectional views of example BGA packages having a heat spreader thermally coupled to the package substrate, according to exemplary embodiments of the invention.
Figure 10B:
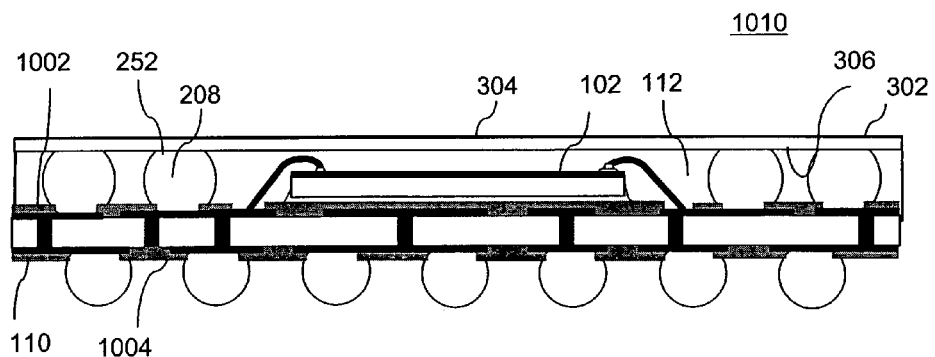
Figure 10C:
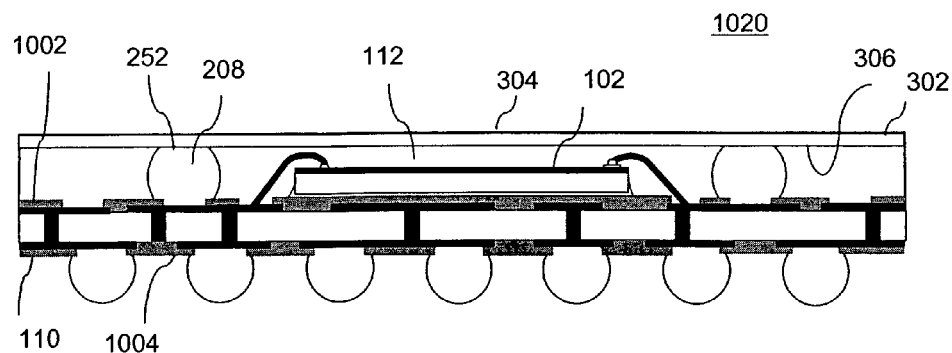

In embodiments, thermal interconnect members may be used to couple a heat spreader to a substrate in an integrated circuit package. For example, FIGS. 10A-10C illustrate cross-sectional views of example BGA packages having a heat spreader thermally coupled to the package substrate, according to exemplary embodiments of the invention. The embodiments of FIGS. 10A-10C are provided for illustrative purposes. In alternative embodiments, thermal interconnect members may be used in other types of IC packages to couple heat spreaders to substrates. Furthermore, when the thermal interconnect members are solder balls, they may be truncated or non-truncated. Other materials such as copper, gold, other metals and/or metal alloys can be used for thermal interconnect members, including the materials described elsewhere herein or otherwise known.

The packages of FIGS. 10A-10C are generally similar to package 300 of FIG. 3A, with some differences described as follows. FIG. 10A shows a package 1000 having a plurality of thermal interconnect members 208 that couple bottom surface 306 of heat spreader 302 to a top surface 1002 of substrate 110. In an embodiment, thermal interconnect members 208 provided a thermally conductive path between substrate 110 and heat spreader 302, such that heat generated by die 102 that passes into substrate 110 can be transferred to heat spreader 302.

Thermal interconnect member 208 may be coupled to top surface 1002 of substrate 110 at a non-electrically conductive location of substrate 110 and/or an electrically conductive location of substrate 110. For example, a bottom surface of thermal interconnect member 208 may be attached to a surface of a solder resist layer or dielectric layer of substrate 110, which are typically non-electrically conductive, and have a relatively low degree of thermal conductivity. In another example, the bottom surface of thermal interconnect member 208 may be attached to an electrically conductive feature 1004 of substrate 110, such as a trace, bond finger, contact pad, ground/power ring, etc., which are typically made of a metal (e.g., a metal foil, plating, etc) such as copper, aluminum, gold, tin, nickel, silver, another metal, or combination of metals/alloy.

In an embodiment where thermal interconnect member 208 couples electrically conductive feature 1004 of substrate 110 to heat spreader 302, thermal interconnect member 208 may provide an electrically conductive path to heat spreader 302 when thermal interconnect member 208 is electrically conductive.

As shown in FIG. 10A, heat spreader 302 has an area that is smaller than an area of a top surface of mold compound 112, such that a peripheral area of the top surface of mold compound 112 is not covered by heat spreader 302. FIG. 10B shows a package 1010 similar to package 1000 of FIG. 10A, except that heat spreader 302 has an area substantially the same as an area of the top surface of mold compound 112.

Any number of thermal interconnect members 208 may be present in embodiments to couple heat spreader 302 to substrate 110, including an array of thermal interconnect members 208. For example, in FIGS. 10A and 10B, a pair of rings of thermal interconnect members 208 encircle die 102 on top surface 1002 of substrate 110. Any number of such rings of thermal interconnect members 208 may be present, when desired. FIG. 10C shows a package 1020 similar to package 1010 of FIG. 10B, except that a single ring of thermal interconnect members 208 encircle die 102 on top surface 1002 of substrate 110.

In embodiments, flowcharts 700, 900, and 950, can be modified to include a step of forming/attaching thermal interconnects to a heat spreader and/or to a substrate to be used to couple the heat spreader to the substrate.

Note that although FIGS. 10A-10C show thermal interconnect members 208 coupled between substrate 110 and heat spreader 302, packages 1000, 1010, 1020 may also include thermal interconnect members 208 coupling the top surface of die 102 to heat spreader 302.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) package, comprising:
   an IC die having a surface;
   a set of thermal interconnect members, each thermal interconnect member of the set of thermal interconnect members being coupled to a respective one of a plurality of hotspots located on the surface of the IC die; and
   a heat spreader coupled to each thermal interconnect member of the set of thermal interconnect members, wherein each thermal connect member of the set of thermal interconnect members is configured to conduct heat from the respective hotspot of the plurality of hotspots to uniformly distribute heat throughout the IC die during operation.

2. The IC package of claim 1, wherein each thermal interconnect member of the set of thermal interconnect members is configured to cause a temperature of a respective location on the IC die to decrease towards a temperature of another location on the IC die during operation of the die.

3. The IC package of claim 1, wherein the IC package further comprises:
   a mold compound that encapsulates the IC die and at least a portion of each thermal interconnect member of the set of thermal interconnect members.

4. The IC package of claim 3, wherein a surface of the mold compound has a cavity formed therein.

5. The IC package of claim 4, wherein the heat spreader is mounted in the cavity.

6. The IC package of claim 3, wherein a portion of each thermal interconnect member of the set of thermal interconnect members is exposed at a surface of the mold compound.

7. The IC package of claim 6, wherein the exposed portion of each thermal interconnect member of the set of thermal interconnect members is planar, and is co-planar with the surface of the mold compound.

8. The IC package of claim 1, further comprising:
   a mold compound that encapsulates the IC die, each thermal interconnect member of the set of thermal interconnect members, and a portion of the heat spreader.

9. The IC package of claim 1, further comprising:
   a mold compound that encapsulates the IC die, each thermal interconnect member of the set of thermal interconnect members, and the heat spreader.

10. The IC package of claim 1, wherein the heat spreader is plated with a material at locations where respective ones of the set of thermal interconnect members are attached.

11. The IC package of claim 10 wherein the material is a solder.

12. The IC package of claim 10, wherein the material is an epoxy.

13. The IC package of claim 1, wherein each of the thermal interconnect members comprises a solder ball.

14. The IC package of claim 13, wherein the solder ball is truncated.

15. The IC package of claim 1, wherein at least one of the set of the thermal interconnect members comprises a metal.

16. The IC package of claim 15, wherein the metal is gold, copper, aluminum, silver, nickel, tin, or a metal alloy.

17. The IC package of claim 1, wherein at least one of the set of thermal interconnect members comprises a thermally conductive epoxy.

18. The IC package of claim 1, wherein at least one of the set of thermal interconnect members comprises a core material coated with a bonding material.

19. The IC package of claim 1, wherein each of the plurality of hotspots corresponds to a location of a functional block of the IC die.

20. The IC package of claim 1, further comprising a wire bond coupled to the surface of the IC die and wherein the heat spreader covers at least a portion of the wire bond.

* * * * *